United States Patent
Morita et al.

(10) Patent No.: US 11,768,255 B2
(45) Date of Patent: Sep. 26, 2023

(54) INTEGRATED CIRCUIT AND DISPLAY DEVICE

(71) Applicant: SEIKO EPSON CORPORATION, Tokyo (JP)

(72) Inventors: Akira Morita, Chino (JP); Shinya Ukai, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/585,738

(22) Filed: Jan. 27, 2022

(65) Prior Publication Data

US 2022/0236340 A1 Jul. 28, 2022

(30) Foreign Application Priority Data

Jan. 28, 2021 (JP) ................................. 2021-011846

(51) Int. Cl.
*G01R 31/64* (2020.01)
*G09G 3/00* (2006.01)

(52) U.S. Cl.
CPC ............. *G01R 31/64* (2020.01); *G09G 3/006* (2013.01); *G09G 2300/0876* (2013.01); *G09G 2330/12* (2013.01)

(58) Field of Classification Search
CPC .................. G01R 31/64; G09G 3/006; G09G 2300/0876; G09G 2330/12; G09G 3/3688; G09G 3/36; G09G 3/3208
See application file for complete search history.

(56) References Cited

U.S. PATENT DOCUMENTS

| | | | |
|---|---|---|---|
| 2002/0039075 A1* | 4/2002 | Mori ................... | H03M 1/0607 341/118 |
| 2008/0007504 A1* | 1/2008 | Kawaura ............... | G09G 3/006 345/904 |
| 2013/0082684 A1* | 4/2013 | Spalding, Jr. .......... | G01R 15/06 324/111 |
| 2013/0321187 A1 | 12/2013 | Chen et al. | |
| 2015/0188557 A1 | 7/2015 | Umezaki et al. | |
| 2015/0233972 A1* | 8/2015 | Ono .................... | G01R 27/2605 324/685 |
| 2015/0309621 A1* | 10/2015 | Zhou ................... | G06F 3/04166 345/174 |
| 2017/0117860 A1* | 4/2017 | Itabashi ................. | H03F 3/602 |
| 2020/0292601 A1* | 9/2020 | Kurachi ............. | G01R 27/2605 |

FOREIGN PATENT DOCUMENTS

| | | |
|---|---|---|
| JP | 2013-251868 A | 12/2013 |
| JP | 2015-128203 A | 7/2015 |
| JP | 2020-148605 A | 9/2020 |

* cited by examiner

*Primary Examiner* — Akm Zakaria
(74) *Attorney, Agent, or Firm* — Oliff PLC

(57) ABSTRACT

An integrated circuit includes a capacitance element to be tested and a test circuit in the same semiconductor substrate, the test circuit includes a capacitance element for testing, and a comparison circuit for comparing a voltage of a node with a voltage of a signal, electrically connects another end of the capacitance element to be tested to the node, applies the voltage of the signal to the node in a first period, changes the voltage of the node based on a capacitance ratio of the capacitance element to be tested and the capacitance element for testing, and tests a capacity size of the capacitance element to be tested based on a comparison result of the comparison circuit in a second period after the first period.

14 Claims, 18 Drawing Sheets

INTEGRATED CIRCUIT AND DISPLAY DEVICE

The present application is based on, and claims priority from JP Application Serial Number 2021-011846, filed Jan. 28, 2021, the disclosure of which is hereby incorporated by reference herein in its entirety.

BACKGROUND

1. Technical Field

The present disclosure relates to an integrated circuit and a display device, for example.

2. Related Art

Techniques for testing a capacity size of a capacitance element formed at a semiconductor substrate include, for example, a technique described in JP 2015-128203 A. Specifically, in the technique described in JP 2015-128203 A, a capacitance element for testing is provided at a semiconductor substrate, separately from a capacitance element to be a test target, and potential generated in the capacitance element as the test target and potential generated in the capacitance element for testing are compared to determine whether accuracy of a capacity size in the capacitance element as the test target is within an intended range or not.

However, in the technique described in JP 2015-128203, as described in paragraph 0041 of the document, there is a need to provide a capacitance element as a test target and a capacitance element for testing of the same capacity size at the same semiconductor substrate. Therefore, in the above technique, there is a problem in that an area of the semiconductor substrate is increased.

SUMMARY

An integrated circuit according to an aspect of the present disclosure is an integrated circuit that includes a capacitance element to be tested and a test circuit in the same semiconductor substrate, and in which one end of the capacitance element to be tested is held at a predetermined voltage, wherein the test circuit includes a capacitance element for testing, and a comparison circuit for comparing a voltage of an input node with a predetermined reference voltage, electrically connects another end of the capacitance element to be tested to an input node of the comparison circuit in a first period, applies a first voltage to the input node, changes a voltage of an input node of the comparison circuit based on a capacitance ratio of the capacitance element to be tested and the capacitance element for testing, and tests a capacity size of the capacitance element to be tested based on a comparison result of the comparison circuit in a second period after the first period.

DESCRIPTION OF EXEMPLARY EMBODIMENTS

Preferred exemplary embodiments of the present disclosure will be described below with reference to the accompanying drawings. Note that the exemplary embodiment described hereinafter is not intended to unjustly limit the content of the present disclosure as set forth in the claims. In addition, all of the configurations described below are not necessarily essential constituent requirements of the present disclosure.

First Exemplary Embodiment

Figure 1:
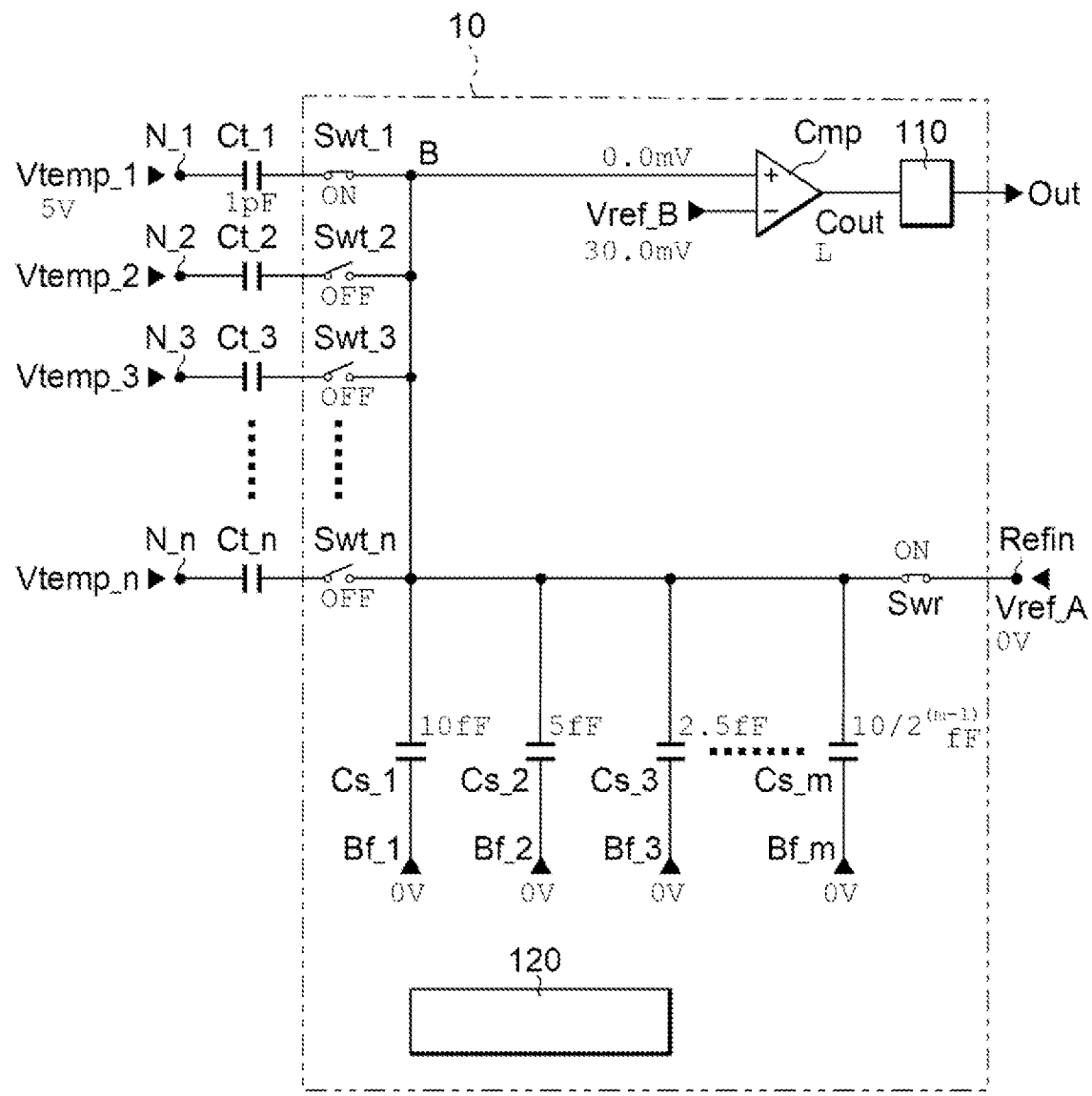
FIG. 1 is a circuit diagram of a periphery of an integrated circuit according to a first exemplary embodiment, including a test circuit.

FIG. 1 is a circuit diagram of a periphery of an integrated circuit according to a first exemplary embodiment, including a test circuit 10. In the figure, in a periphery of the test circuit 10, n capacitance elements $Ct\_1$ to $Ct\_n$ to be tested are provided along with elements constituting the test circuit 10 at the same semiconductor substrate.

Each of the capacitance elements $Ct\_1$ to $Ct\_n$ to be tested is a capacitance element (capacitor) to be a test target. In the present exemplary embodiment, any one of the capacitance elements $Ct\_1$ to $Ct\_n$ to be tested is selected in sequence to be a test target.

The test circuit 10 includes a determination circuit 110, a control circuit 120, n switches Swt_1 to Swt_n, Swr, m capacitance elements Cs_1 to Cs_m for testing, and a comparison circuit Cmp.

The switch Swt_1 is provided corresponding to the capacitance element Ct_1 to be tested, the switch Swt_2 is provided corresponding to the capacitance element Ct_2 to be tested, and similarly, the switch Swt_n is provided corresponding to the capacitance element Ct_n to be tested.

In the capacitance element Ct_1 to be tested, one end is electrically connected to a node N_1, and another end is electrically connected to one end of the switch Swt_1. A signal Vtemp_1 is supplied to the node N_1. A voltage of the signal Vtemp_1 is optional and is temporally and substantially constant. In the capacitance element Ct_2 to be tested, one end is electrically connected to a node N_2, and another end is electrically connected to one end of the switch Swt_2. A signal Vtemp_2 is supplied to the node N_2. A voltage of the signal Vtemp_2 is optional and is temporally and substantially constant. Hereinafter, a signal Vtemp_n is supplied to a node N_n. A voltage of the signal Vtemp_n is optional and is temporally and substantially constant.

Another end of each of the switches Swt_1 to Swt_n is commonly electrically connected to a node B.

The capacitance elements Cs_1 to Cs_m for testing are used in testing a capacity size of a capacitance element selected as a test target from the capacitance elements Ct_1 to Ct_n to be tested. Note that, in the present description, a "test" refers to measuring a capacity size, or determining whether the capacity size is within a predetermined range or not.

When a capacity size of the capacitance element Cs_1 for testing is "1", capacity sizes of the capacitance elements Cs_2, Cs_3, ..., Cs_m for testing are, for example, "1/2", "1/4", ..., "$1/2^{(m-1)}$", respectively. Note that, specifically, when the capacity size of the capacitance element Cs_1 for testing is 10 fF, the capacity sizes of the capacitance elements Cs_2, Cs_3, ..., Cs_m for testing are, in order, 5 fF, 2.5 fF, ..., $\{10/2^{(m-1)}\}$ fF, respectively.

One end of each of the capacitance elements Cs_1 to Cs_m for testing is commonly electrically connected to the node B. Signals Bf_1, Bf_2, Bf_3, ..., Bf_m are supplied to another ends of the capacitance elements Cs_1 to Cs_m for testing, respectively, in this order.

One end of the switch Swr is electrically connected to the node B, and another end of the switch Swr is supplied with a signal Vref_A via a node Refin.

Note that, the node Refin is an example of a first node. Additionally, in the present description, nodes include a separately provided terminal, an electrode, as well as wiring provided at the semiconductor substrate.

Turning on each of the switches Swt_1 to Swt_n and Swr means that one end and another end are closed and conducting, or are in a low impedance state, and turning off the switch means that the one end and the other end are open and are in a non-conducting state or in a high impedance state. The switches Swt_1 to Swt_n and Swr are each constituted by a transistor that turns on or off between source and drain nodes in accordance with, for example, a voltage of a gate node.

The comparison circuit Cmp compares a voltage applied to a positive input end (+) with a voltage of a signal Vref_B applied to a negative input end (−), and outputs a signal Cout indicating a result of the comparison. Specifically, the comparison circuit Cmp outputs the signal Cout at an H level when the voltage of the positive input end (+) is equal to or greater than the voltage of the signal Vref_B, and outputs the signal Cout at an L level when the voltage of the positive input end (+) is less than the voltage of the signal Vref_B.

Note that, a power supply voltage of the comparison circuit Cmp is not particularly illustrated, but is, for example, 1.8 V (volts). When the power supply voltage of the comparison circuit Cmp is 1.8 V, of the logic levels of the signal Out indicating the comparison result, the H level is 1.8 V, and the L level is 0 volts. Additionally, in the present exemplary embodiment, the positive input end (+) of the comparison circuit Cmp, that is, the node B is an example of an input node.

The determination circuit 110 tests a capacity size of a capacitance element to be tested selected as a test target based on a logic level of the signal Out, and outputs the signal Out indicating a result of the test.

The control circuit 120 controls the switches Swt_1 to Swt_n, and Swr to be on or off individually, and controls voltages of the signals Bf_1 to Bf_m, Vref_A, and Vref_B.

Next, operation of the test circuit 10 according to the first exemplary embodiment will be described.

For convenience, a case in which the capacitance element Ct_1 to be tested is selected as a test target will be described. Note that, a case is assumed in which a capacity size of the capacitance element Ct_1 to be tested is around 1.00 pF (=1000 fF), m=8, and the capacitance elements Cs_1 to Cs_8 for testing are provided. When the capacity size of the capacitance element Cs_1 for testing is 10 fF, a capacity size of the capacitance element Cs_8 for testing is 0.078 fF.

In the present exemplary embodiment, a basic operation for the test circuit 10 to test a capacity size of one capacitance element to be tested is divided into two of a first period and a second period.

First, as illustrated in FIG. 1, the control circuit 120 in a first first period turns on the switch Swt_1 corresponding to the capacitance element Ct_1 to be tested as a test target, and turns off the switches Swt_2 to Swt_n corresponding to the other capacitance elements Ct_2 to Ct_n to be tested. In addition, the control circuit 120 turns on the switch Swr, sets the voltage of the signal Vtemp_1, for example, to 5.0 V, sets the voltages of the signal Bf_1 to Bf_m, Vref_A to 0 V, and sets the voltage of the signal Vref_B to 30.0 mV. Thus, in the first period, the negative input end (−) is at 30.0 mV with respect to 0 V of the node B, that is, the positive input end (+) of the comparison circuit Cmp, thus the signal Cout is at the L level.

Note that, 0 V of the signal Vref_A in the first period is an example of a first voltage.

In addition, in the first period, one end and another end have the same potential in each of the capacitance elements Cs_1 to Cs_8 for testing. Thus, a charge accumulated in each of the capacitance elements Cs_1 to Cs_8 for testing is reset to zero.

Figure 2:
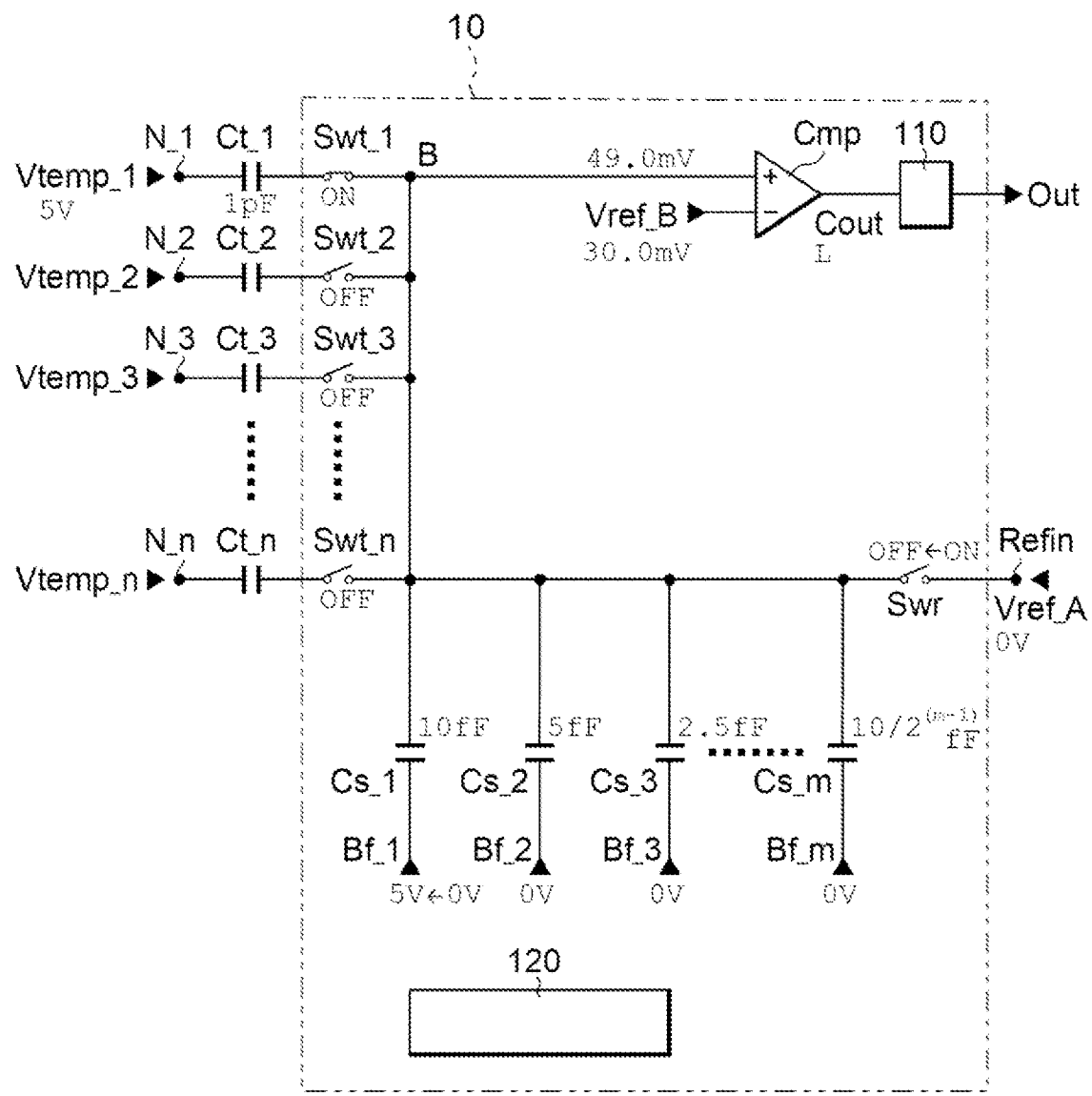
FIG. 2 is a diagram illustrating operation of the test circuit.

Next, in the second period after the first period, the control circuit 120 turns off the switch Swr while turning on the switch Swt_1, as illustrated in FIG. 2. Turning off the switch Swr electrically unconnects the node Refin from the node B.

Further, the control circuit 120 changes the voltage of the signal Bf_1 from 0 V to 5 V, while maintaining the voltages of the signals Bf_2 to Bf_m at 0 V. Since the capacity size of the capacitance element Cs_1 for testing is 10 fF, the charge that moves due to the change in voltage of the signal Bf_1 is 50 fC (=5 V×10 fF).

As described above, when the capacitance elements Cs_1 to Cs_8 for testing are provided where m=8, the capacity size as viewed from the node B is approximately 1020 fF. The capacity size is combined capacitance of 1000 fF of the capacitance element Ct_1 to be tested and 20 fF of the capacitance elements Cs_1 to Cs_8 for testing.

Thus, when the actual capacity size of the capacitance element CT_1 to be tested is 1.00 pF correctly, the voltage of the node B rises by 50 fC/1020 fF, that is, 49.0 mV. Therefore, in the comparison circuit Cmp, the negative input end (−) is at 30.0 mV with respect to 49.0 mV of the positive input end (+), so the signal Cout is inverted to the H level.

On the other hand, when the actual capacity size of the capacitance element Ct_1 to be tested is equal to or greater than 1.65 pF, the voltage of the node B in the second period is less than 30.0 mV, so the signal Cout is maintained at the L level and is not inverted.

Accordingly, the determination circuit 110 can determine that the actual capacity size of the capacitance element Ct_1 to be tested is equal to or greater than 1.65 pF, when the logic level of the signal Cout is maintained at the L level from the first period to the second period.

Cases in which the signal Cout is inverted to the H level include a case in which the actual capacity size of the capacitance element Ct_1 to be tested is out of an assumed range and is less than 1.00 pF. Thus, when the signal Cout is inverted to the H level in the second period, the control circuit 120 repeats the same operation again using a capacitance element smaller than the capacitance element Cs_1 for testing, for example, the capacitance element Cs_2 for testing.

Specifically, in a second first period, the control circuit 120 turns on the switches Swt_1 and Swr as illustrated in FIG. 1, turns off the other switches Swt_2 to Swt_n, sets the voltage of the signal Vtemp_1 to 5.0 V, sets the voltages of the signals Bf_1 to Bf_m, Vref_A to 0 V, and sets the voltage of the signal Vref_B to 30.0 mV. In this way, the signal Cout is again at the L level.

Figure 3:
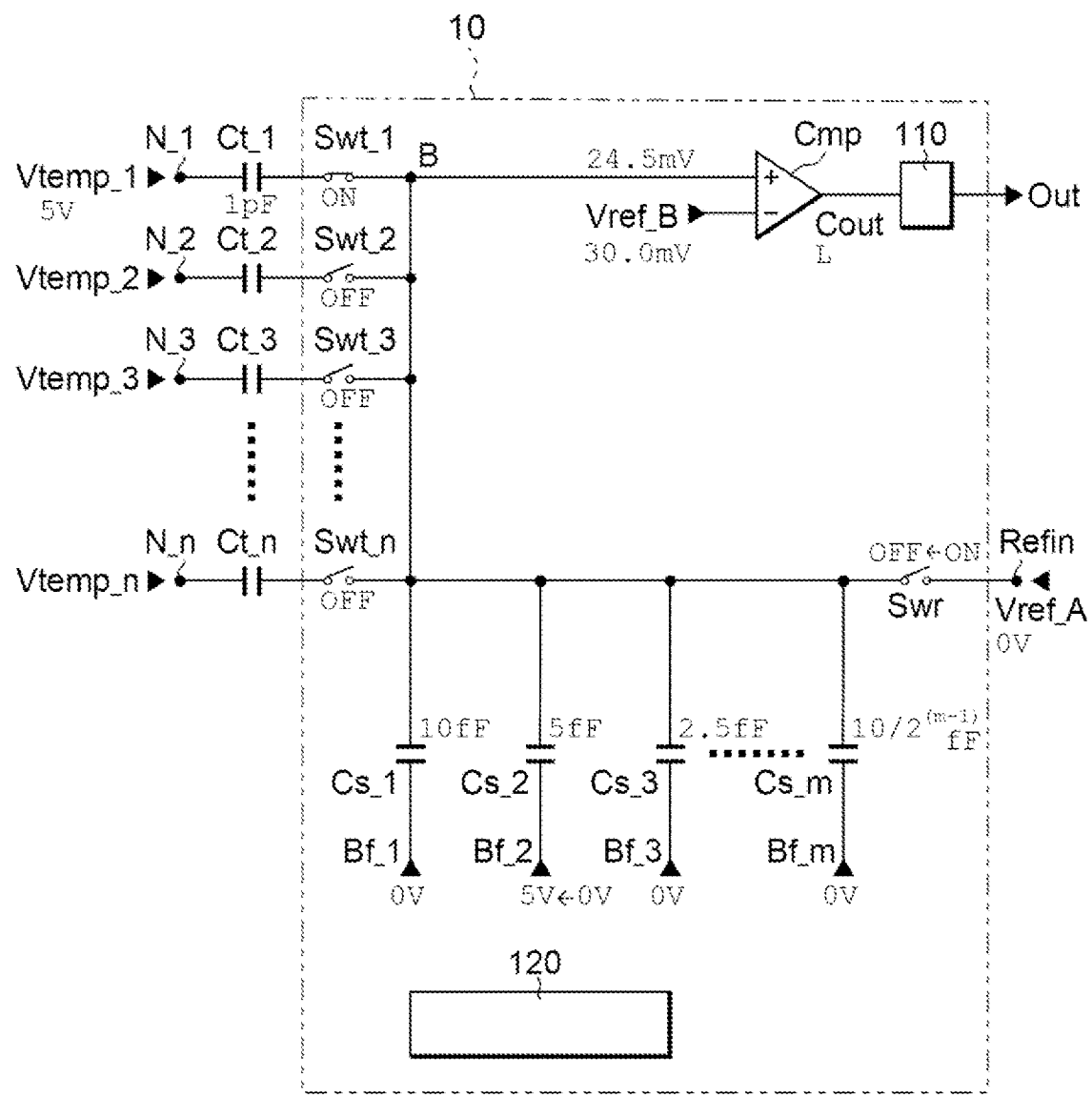
FIG. 3 is a diagram illustrating the operation of the test circuit.

Next, in a second second period, as illustrated in FIG. 3, the control circuit 120 turns off the switch Swr, while turning on the switch Swt_1, and changes the voltage of the signal Bf_2 from 0 V to 5 V while maintaining the voltages of the signals Bf_1, Bf_3 to Bf_m at 0 V. Since the capacity size of the capacitance element Cs_2 for testing is 5 fF, a charge that moves due to change in voltage of the signal Bf_2 is 25 fC.

Thus, when the capacity size of the capacitance element CT_1 to be tested is 1.00 pF, the voltage of the node B rises by 25 fC/1020 fF, that is, 24.5 mV. Therefore, in the comparison circuit Cmp, the negative input end (−) is at 30.0 mV with respect to 24.5 mV of the positive input end (+), so the signal Cout is maintained at the H level.

On the other hand, when the actual capacity size of the capacitance element Ct_1 to be tested is less than 0.814 pF, the voltage of the node B is equal to or greater than 30.0 mV in the second second period, thus the signal Cout is inverted to the H level.

Accordingly, the determination circuit 110 can determine that the actual capacity size of the capacitance element Ct_1 to be tested is within an assumed range including 1.00 pF, specifically equal to or greater than 0.814 pF, and in a range of less than 1.65 pF, provided that the logic level of the signal Cout is maintained at the L level from the second first period to the second second period.

In addition, the determination circuit 110 can determine that the actual capacity size of the capacitance element Ct_1 to be tested is less than 0.814 pF, provided that the logic level of the signal Cout is inverted to the H level from the second first period to the second second period.

Note that, the capacitance element Cs_1 for testing is an example of a first capacitance element for testing, and the capacitance element Cs_2 for testing is an example of a second capacitance element for testing.

Note that, when the signal Cout is inverted in second determination, the control circuit 120 repeats the third same operation using a capacitance element smaller than the capacitance element Cs_2 for testing, for example, the capacitance element Cs_3 for testing.

Although not particularly illustrated, in the third second period, a charge that moves due to the change in voltage of the signal Bf_3 is 12.5 fC. Thus, in third determination, when the actual capacity size of the capacitance element Ct_1 to be tested is equal to or greater than 0.398 pF, the signal Cout is maintained at the L level, and when the actual capacity size is less than 0.398 pF, the signal Cout is inverted to the H level.

Therefore, in the third determination, it can be determined that the actual capacity size of the capacitance element Ct_1 to be tested is in a rage of equal to or greater than 0.398 pF and less than 0.814 pF, provided that the logic level of the signal Cout is maintained at the L level. Furthermore, in the third determination, it can be determined that the actual capacity size of the capacitance element Ct_1 to be tested is less than 0.398 pF, provided that the logic level of the signal Cout is inverted to the H level.

Hereinafter, provided that the logic level of the signal Cout is inverted to the H level, by switching the capacitance elements to be tested used in testing in sequence to Ct_4, Ct_5, . . . , Ct_8 to maintain the signal Count at the L level, it can be tested that in which range the actual capacity size of the capacitance element Ct_1 to be tested is.

Note that, the description has been given using the case as an example in which the capacitance element Ct_1 to be tested is selected as the test target, for example, from the capacitance elements Ct_1 to Ct_n to be tested, but by selecting the capacitance elements Ct_2, Ct_3, . . . , Ct_n sequentially one at a time, to perform the same operation, it is possible to similarly perform testing for the capacitance elements Ct_2 to Ct_n to be tested.

In the first exemplary embodiment, an amount of voltage change of the node B when transitioning from the first period to the second period is a product obtained by multiplying a quotient obtained by dividing the capacity size of the capacitance element for testing used by a sum of the capacity size of the capacitance element to be tested as the test target and the capacitance elements Ct_1 to Ct_n to be tested (capacitance ratio) by an amount of voltage change in the capacitance element for testing.

As described above, when one capacitance element is selected as a test target from the capacitance elements Ct_1 to Ct_n to be tested, the logic level of the signal Cout is not inverted when the amount of voltage change of the node B in a first test is less than the signal Vref_B. When the capacity size of the capacitance element for testing is the maximum in a predetermined test, since it is only possible to test that the actual capacity size of the capacitance element to be tested selected as the test target is equal to or greater than a predetermined value, it is desirable that the voltage of the signal Vref_B is set to be less than the amount of voltage change of the node B.

Note that, in the first exemplary embodiment, the voltage of the signal Vref_B is constant at 30.0 mV in the first period and the second period, but a configuration to change the voltage may be adopted.

Specifically, the control circuit 120 sets the voltage of the signal Vref_B to a voltage equal to or greater than the voltage of the signal Vref_A, for example, 1.0 mV in the first period. Thus, the signal Cout is at the H level.

Next, the control circuit 120 gradually raises and changes the voltage of the signal Vref_B in the second period.

When the voltage of the signal Vref_B gradually changes in the second period, the determination circuit 110 determines the actual capacity size of the capacitance element Ct_1 to be tested by a voltage a of the signal Vref_B when the signal Cout is inverted from the H to L level.

Specifically, when the voltage of the signal Vref_B when the signal Cout is inverted is a (V), the determination circuit 110 determines X (fF) of the capacity size in the capacitance element Ct_1 to be tested with Equation (1) below.

$$X=(50-20 \times a)/a \quad (1)$$

For example, when the voltage a of the signal Vref_B when the signal Cout is inverted is 0.030 V (=30.0 mV), the determination circuit 110 determines, based on Equation (1), that the capacity size in the capacitance element Ct_1 to be tested is 1650 fF (=1.65 pF).

Further, when the voltage a of the signal Vref_B when the signal Cout is inverted is 0.060 V (=60.0 mV), the determination circuit 110 determines, based on Equation (1), that the capacity size in the capacitance element Ct_1 to be tested is 813 fF (=0.813 pF). Further, for example, when the voltage a of the signal Vref_B when the signal Cout is inverted is 0.061 V (=60.1 mV), the determination circuit 110 determines, based on Equation (1), that the capacity size in the capacitance element Ct_1 to be tested is 800 fF (=0.800 pF).

In other words, when the voltage a of the signal Vref_B when the signal Cout is inverted is in a range of equal to or greater than 30.0 mV and less than 60.1 mV, the determination circuit 110 can determine that the capacity size in the capacitance element Ct_1 to be tested is in a range of equal to or greater than 0.814 pF and less than 1.65 pF.

Note that, when the voltage a of the signal Vref_B when the signal Cout is inverted is 0.049 V (=49.0 mV), the capacity size in the capacitance element Ct_1 to be tested is 1000 fF (=1.0 pF).

In this manner, in the configuration in which the voltage of the signal Vref_B is gradually changed in the second period, and the capacity size in the capacitance element to be tested is tested based on the voltage a of the signal Vref_B when the logic level of the signal Cout is inverted, it is not necessary to repeat the first period and the second period multiple times. Thus, in this configuration, the capacity size in the capacitance element to be tested can be tested in a short period, compared to a configuration in which the first period and the second period are repeated multiple times.

Alternatively, rather than gradually changing the voltage of the signal Vref_B in the second period, by switching the voltage to two voltages of 30.0 mV and 60.1 mV, a determination may be made based on the logic level of the signal Cout, in the above example. Specifically, when the signal Cout is inverted to the L level when the voltage of the signal Vref_B is 30.0 mV, and then the signal Cout is inverted to the H level again when the voltage of signal Vref_B is 60.1 mV, then it can be tested that the capacity size of the capacitance element Ct_1 to be tested is in a range of equal to or greater than 0.814 pF and less than 1.65 pF.

Note that, when the signal Cout is maintained at the H level when the voltage of the signal Vref_B is 30.0 mV in the second period, it can be tested that the capacity size of the capacitance element Ct_1 to be tested is equal to or greater than 1.65 pF. In addition, when the signal Cout is at the L level when the voltage of the signal Vref_B is 60.1 mV, then it can be tested that the capacity size of the capacitance element Ct_1 to be tested is less than 0.814 pF.

30.0 mV and 60.1 mV of the voltage of the signal Vref_B in the second period are merely examples, and the voltage is determined by a lower limit and an upper limit of a range of the capacity size to be satisfied by the capacitance element to be tested.

In a fourth exemplary embodiment described below, 30.0 mV is an example of a first reference voltage, and 60.1 mV is an example of a second reference voltage.

Note that, the description has been given by using only one of the capacitance elements Cs_1 to Cs_m for testing in the first exemplary embodiment, but a combination may be used as appropriate. For example, when the two capacitance elements Cs_1 and Cs_2 for testing are used, the signals Bf_1 and Bf_2 only need to be changed from 0 V to 5 V in the second period. When the signals Bf_1 and Bf_2 are changed from 0 V to 5 V, a charge that moves is 75 fC.

In addition, when the capacitance element Ct_1 to be tested is selected as a test target, for example, from the capacitance elements Ct_1 to Ct_n to be tested, parasitic capacitance in addition to the capacitance element Ct_1 to be tested is added to the node B. In this case, in the first exemplary embodiment, since the switch Swt_1 is on during the first period and the second period, the parasitic capacitance can be handled as in a state of being electrically connected in parallel to the capacitance element Ct_1 to be tested. Thus, in the first exemplary embodiment, the test circuit 10 will actually test combined capacity obtained by including parasitic capacitance in the capacitance element to be tested selected as a test target.

Second Exemplary Embodiment

In the first exemplary embodiment, the configuration has been adopted in which the signals Bf_1 to Bf_m are sequentially supplied to the other ends of the capacitance elements Cs_1 to Cs_m for testing, respectively. In this configuration, for example, when the voltage of the signal Bf_1 is changed using the capacitance element Cs_1 for testing, charge movement due to the voltage change also extends to the other capacitance elements Cs_2 to Cs_m for testing.

Thus, a second exemplary embodiment will be described next in which charge movement due to a voltage change extends only to limited capacitance elements for testing.

Figure 4:
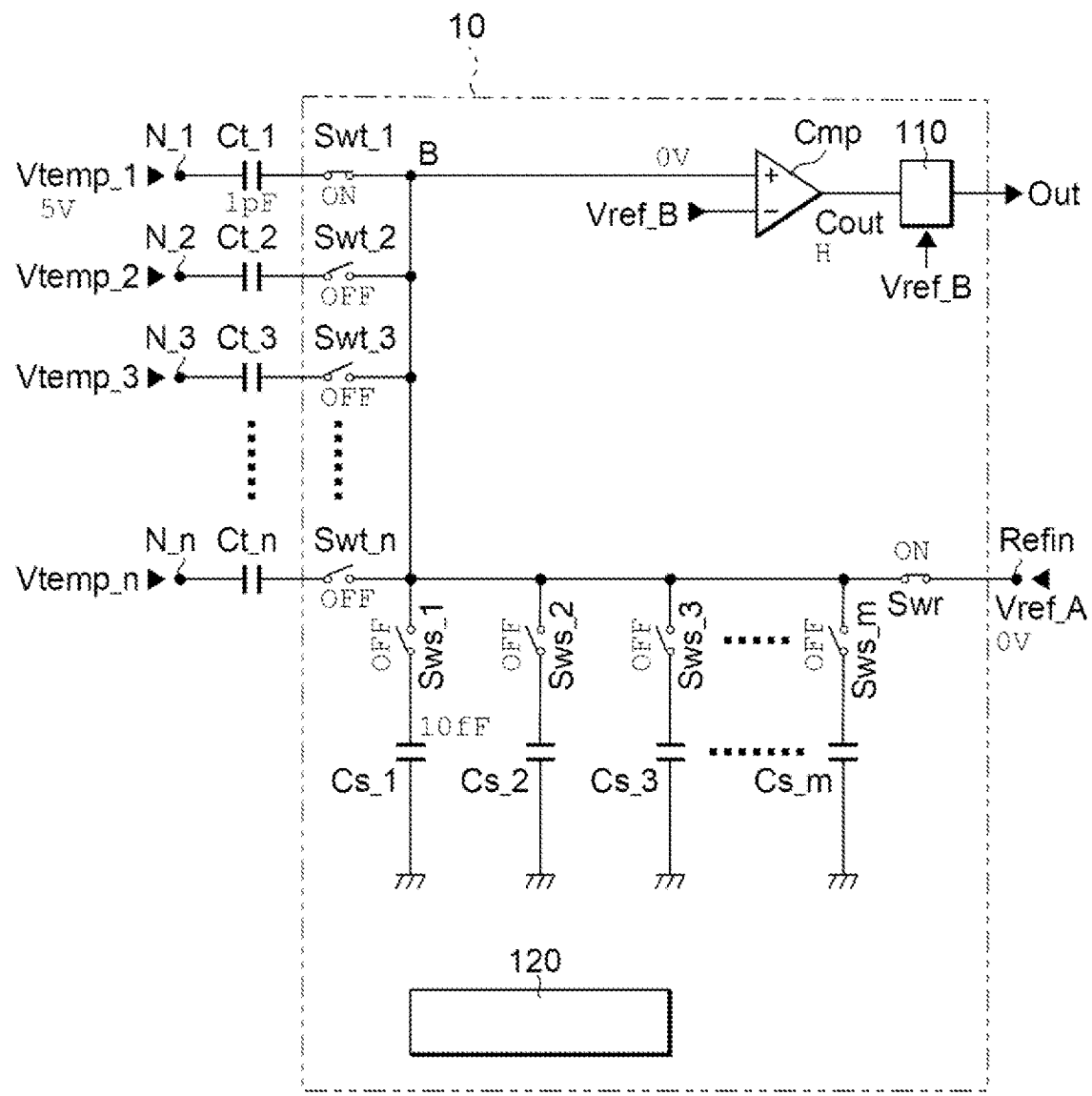
FIG. 4 is a circuit diagram of a periphery of an integrated circuit according to a second exemplary embodiment, including a test circuit.

FIG. 4 is a circuit diagram illustrating the test circuit 10 and the like of an integrated circuit according to the second exemplary embodiment.

In the second exemplary embodiment, in comparison to the first exemplary embodiment illustrated in FIG. 1, in a one-to-one correspondence with the capacitance elements Cs_1 to Cs_m for testing, switches Sws_1 to Sws_m are provided in this order. In addition, in the second exemplary embodiment, the signal Vref_B is supplied to the determination circuit 110 from the control circuit 120.

In the second exemplary embodiment, the switch Sws_1 is provided between the node B and the capacitance element Cs_1 for testing. Specifically, one end of the switch Sws_1 is electrically connected to the node B, and another end of the switch Sws_1 is electrically connected to one end of the capacitance element Cs_1 for testing. The switch Sws 2 is provided between the node B and the capacitance element Cs_2 for testing, the switch Sws_3 is provided between the node B and the capacitance element Cs_3 for testing, and, similarly, the switch Sws_m is provided between the node B and the capacitance element Cs_m for testing.

In addition, in the second exemplary embodiment, another end of each of the capacitance elements Cs_1 to Cs_m for testing is grounded to potential Gnd that is a reference of a voltage of zero. Note that, the other end of each of the capacitance elements Cs_1 to Cs_m for testing only needs to be maintained temporally and substantially at the same constant electric potential, not limited to the potential Gnd.

Next, operation of the test circuit 10 according to the second exemplary embodiment will be described.

For convenience, as in the first exemplary embodiment, description will be given assuming that the capacitance element Ct_1 to be tested is selected as a test target, and a capacity size of the capacitance element Ct_1 to be tested is near 1.00 pF.

In the second exemplary embodiment, a basic operation for the test circuit 10 to test a capacity size of one capacitance element to be tested is divided into three of a first period, a second period, and a third period.

First, in a first first period, the control circuit 120 turns on the switches Swt_1 and Swr, turns off the switches Swt_2 to Swt_n, and turns off the switches Sws_1 to Sws_m, as illustrated in FIG. 4.

In addition, the control circuit 120 sets a voltage of the signal Vtemp_1 to, for example, 5.0 V, sets a voltage of the signal Vref_A to 0 V, and sets a voltage of the signal Vref_B to less than 0 V. Note that, 0 V of the signal Vref_A in the second period is an example of a first voltage.

In the first period, a negative input end (−) is less than 0 V with respect to 0 V of the node B, so the signal Cout is at the H level.

Figure 5:
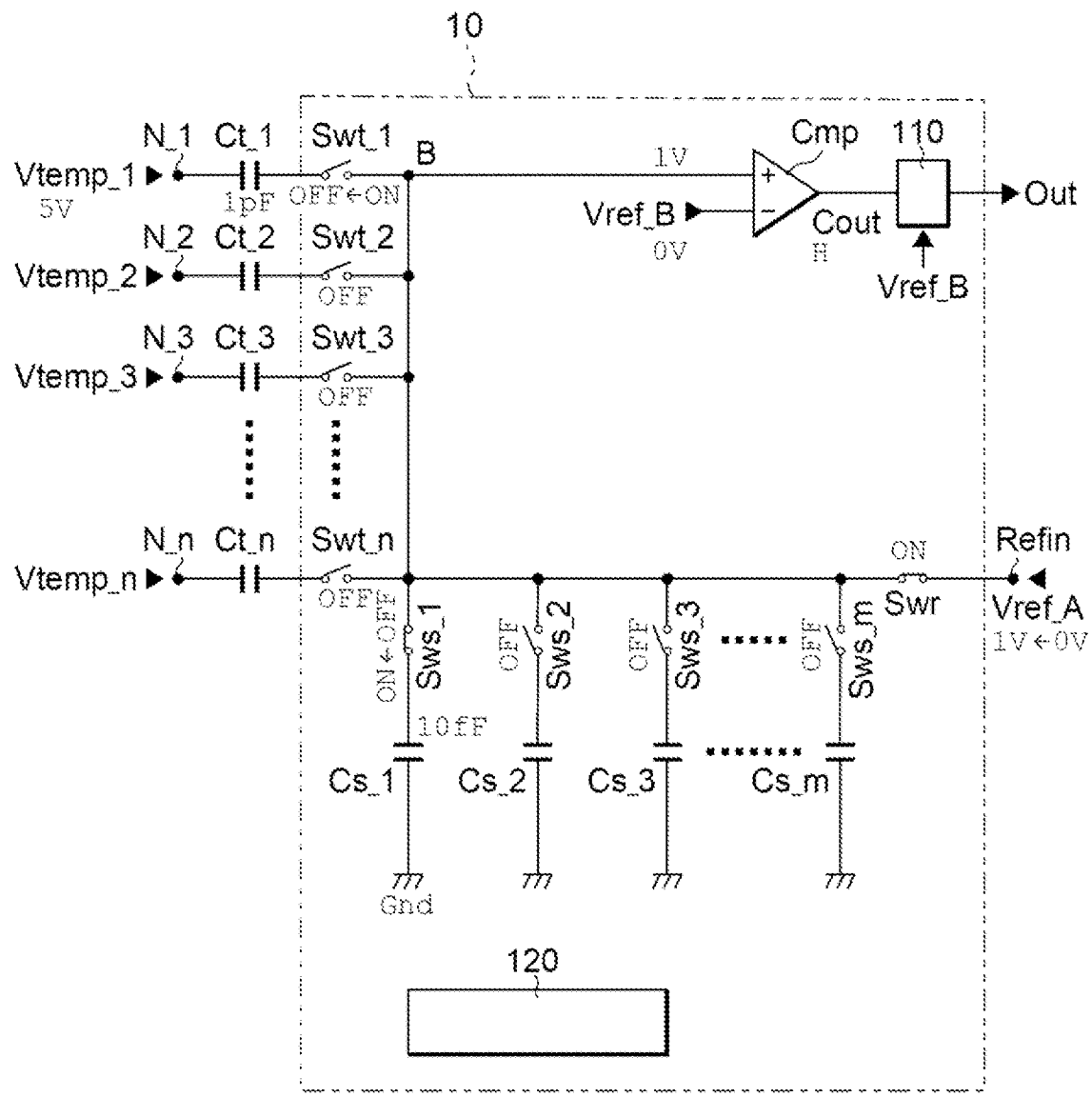
FIG. 5 is a diagram illustrating operation of the test circuit.

In the second period after the first period, the control circuit 120 turns off the switch Swt_1 and turns on the switch Sws_1 as illustrated in FIG. 5. Further, the control circuit 120 changes the voltage of the signal Vref_A from 0 V to 1 V. A charge of 10 fC is accumulated in the capacitance element Cs_1 for testing by turning on the switch Sws_1.

Note that, 1 V of the signal Vref_A in the second period is an example of a second voltage.

Also, in the second period, the signal Cout is maintained at the H level.

Figure 6:
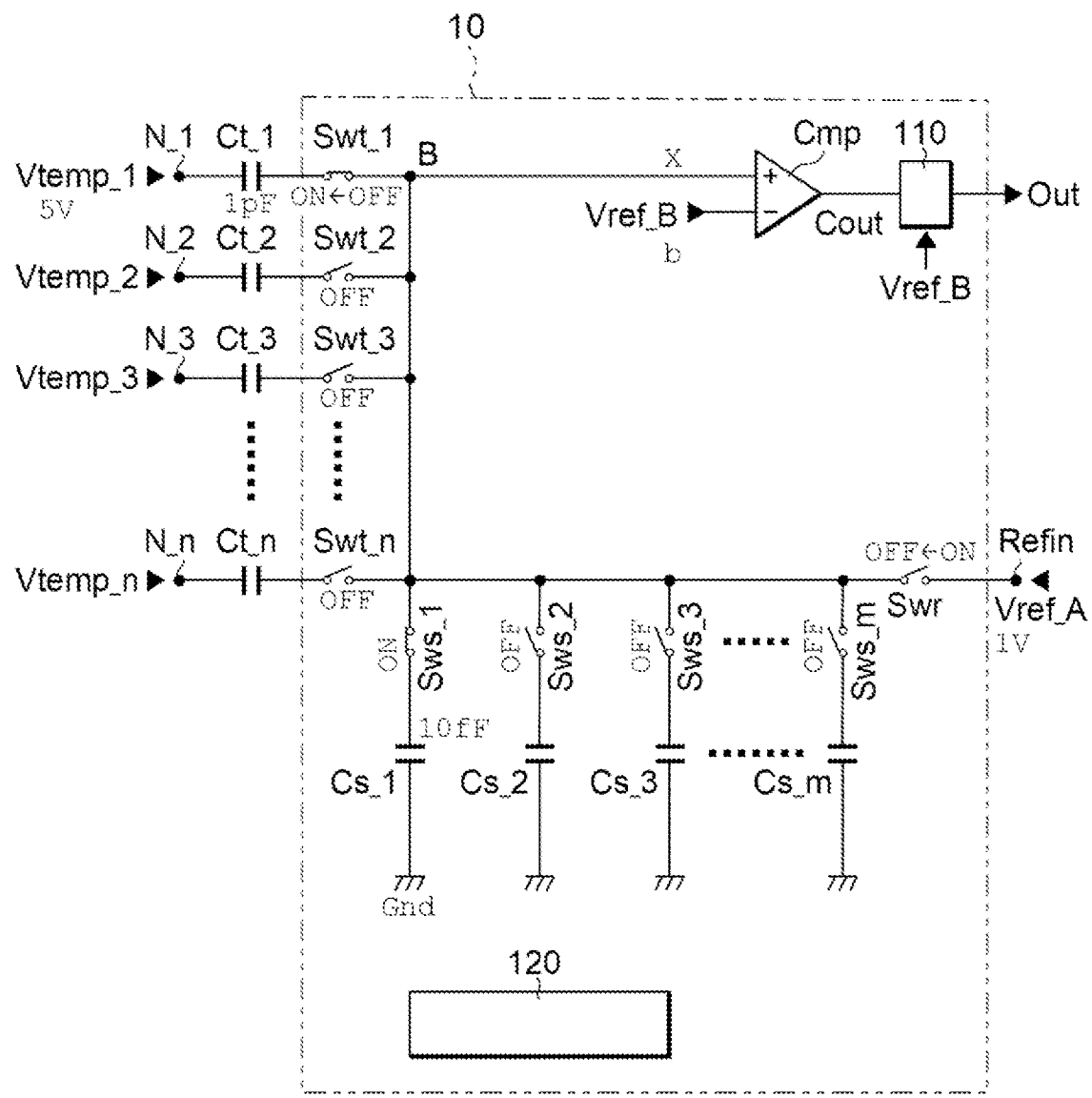
FIG. 6 is a diagram illustrating the operation of the test circuit.

In the third period after the second period, the control circuit 120 turns on the switch Swt1 after turning off the switch Swr, as illustrated in FIG. 6. When a capacity size in the capacitance element Ct_1 to be tested is X (fF), a capacity size of combined capacitance of the capacitance element Ct_1 to be tested and the capacitance element Cs_1 for testing is (X+10) fF as viewed from the node B, in the third period. The charge of 10 fC accumulated in the capacitance element Cs_1 for testing in the second period is redistributed to the combined capacity in the third period. This redistribution reduces the voltage of the node B from 1 V in the second period by {10/(X+10)} V.

Conversely, in the third period, a voltage b of the node B can be represented by the following Equation (2).

$$1-b=\{10/(X+10)\} \quad (2)$$

This Equation (2) can be solved for X, and is represented as the following Equation (3).

$$X=10 \times b/(1-b) \quad (3)$$

The determination circuit 110 determines an actual capacity size of the capacitance element Ct_1 to be tested by substituting the voltage b of the signal Vref_B when the signal Cout is inverted from the H to L level in the third period into Equation (3) above.

For example, when the voltage b of the signal Vref_B when the signal Cout is inverted is 0.994 V (=994 mV), the determination circuit 110 determines, based on Equation (3), that the capacity size in the capacitance element Ct_1 to be tested is 1657 fF (=1.66 pF).

Further, for example, when the voltage b of the signal Vref_B when the signal Cout is inverted is 0.988 V (=988 mV), the determination circuit 110 determines, based on Equation (3), that the capacity size in the capacitance element Ct_1 to be tested is 823 fF (=0.823 pF).

In other words, when the voltage b of the signal Vref_B when the signal Cout is inverted is in a range of equal to or greater than 988 mV and less than 994 mV, the determination circuit 110 can test that the capacity size in the capacitance element Ct_1 to be tested is in a range of equal to or greater than 0.823 pF and less than 1.66 pF.

Note that, when the voltage b of the signal Vref_B when the signal Cout is inverted is 0.990 V (=990 mV), the capacity size in the capacitance element Ct_1 to be tested is 1000 fF (=1.0 pF).

Alternatively, rather than gradually changing the voltage of the signal Vref_B, by switching the voltage of the signal Vref_B to two voltages of 988 mV and 994 mV in the third period in the above example, a determination may be made based on the logic level of the signal Cout. Specifically, when the signal Cout is at the H level when the voltage b of the signal Vref_B is 988 mV, and the signal Cout is at the L level when the voltage of signal Vref_B is 994 mV, then it can be tested that the capacity size of the capacitance element Ct_1 to be tested is in a range of equal to or greater than 0.823 pF and less than 1.66 pF.

Note that, when the signal Cout is inverted to the L level when the voltage of the signal Vref_B is 994 mV, it can be tested that the capacity size of the capacitance element Ct_1 to be tested is equal to or greater than 1.66 pF. In addition, when the signal Cout is maintained at the H level when the voltage of the signal Vref_B is 988 mV, then it can be tested that the capacity size of the capacitance element Ct_1 to be tested is less than 0.823 pF.

Note that, the second exemplary embodiment is the same as the first exemplary embodiment in that the capacitance elements to be tested as the test targets are selected one at a time, and that the capacitance element for testing is selected in accordance with the capacity size of the capacitance element to be tested as the test target.

In addition, the capacity size of the capacitance element to be tested selected as the test target is tested together with the parasitic capacitor of the node B as in the case in the first exemplary embodiment.

According to the second exemplary embodiment, the capacity size of each of the capacitance elements Cs_1 to Cs_m for testing can be smaller than the capacity size of the capacitance element to be tested selected as the capacitance element to be tested test target, thus an area of the semiconductor substrate can be prevented from being too large.

Third Exemplary Embodiment

Next, a third exemplary embodiment will be described.

Figure 7:
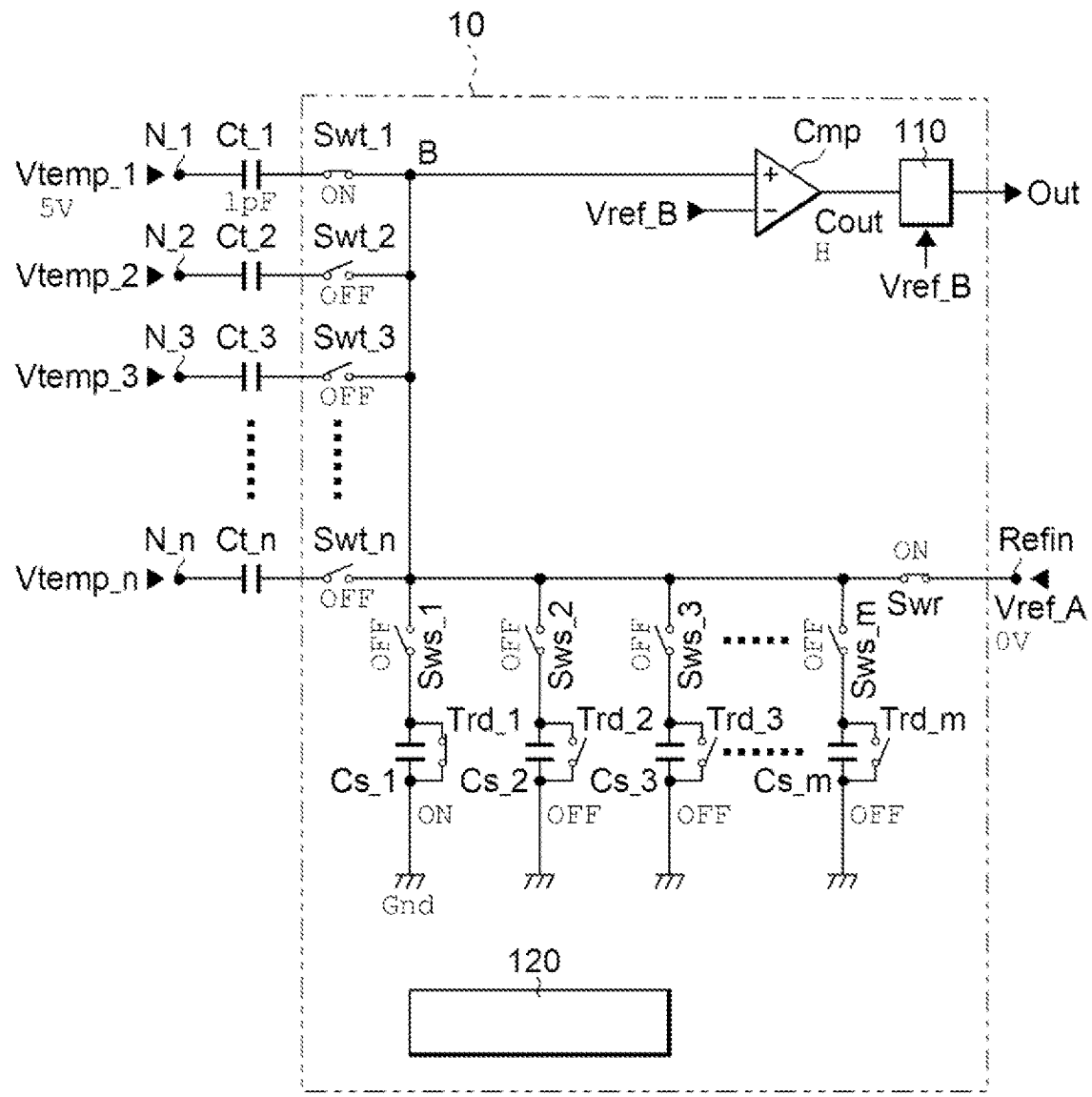
FIG. 7 is a circuit diagram of a periphery of an integrated circuit according to a third exemplary embodiment, including a test circuit.

FIG. 7 is a circuit diagram illustrating the test circuit 10 and the like of an integrated circuit according to the third exemplary embodiment.

In the third exemplary embodiment, switches Trd_1 to Trd_m are provided in a one-to-one correspondence with the capacitance elements Cs_1 to Cs_m for testing, in comparison to the second exemplary embodiment illustrated in FIG. 4. Specifically, the switch Trd_1 is provided corresponding to the capacitance element Cs_1 for testing, the switch Trd_2 is provided corresponding to the capacitance element Cs_2 for testing, and, similarly, the transistor Trd_m is provided corresponding to the capacitance element Cs_m for testing.

Here, when any integer i from 1 to m is used to generally describe the capacitance elements Cs_1 to Cs_m for testing and the switches Trd_1 to Trd_m, one end of the switch Trd_i is electrically connected to one end of the capacitance element Cs_i for testing, and another end of the switch Trd_i is electrically connected to another end of the capacitance element Cs_i for testing.

Note that, the switches Trd_1 to Trd_m are individually turned on or off by the control circuit 120. Additionally, the switches Trd_1 to Trd_m are actually constituted by transistors. Specifically, when the switch Trd_i is constituted by a transistor, a drain node of the transistor is electrically connected to one end of the capacitance element Cs_i for testing, a source node of the transistor is electrically connected to another end of the capacitance element Cs_i for testing, and a control signal specifying on or off is supplied to a gate node of the transistor from the control circuit 120.

Next, operation of the test circuit 10 according to the third exemplary embodiment will be described. For convenience, description will be given assuming that the capacitance element Ct_1 to be tested is selected as a test target, and a capacity size of the capacitance element Ct_1 to be tested is near 1.00 pF.

In the third exemplary embodiment, a basic operation for the test circuit 10 to test a capacity size of one capacitance element to be tested is divided into three of a first period, a second period, and a third period.

First, in a first first period, as illustrated in FIG. 7, the control circuit 120 turns on the switches Swt_1 and Swr, and turns off the switches Swt_2 to Swt_n, turns off the switches Sws_1 to Sws_m, turns on the switch Trd_1, and turns off the switches Trd_2 to Trd_m.

In addition, the control circuit 120 sets a voltage of the signal Vtemp_1 to, for example, 5.0 V, sets a voltage of the signal Vref_A to 0 V, and sets a voltage of the signal Vref_B to less than 0 V. In the first period, a negative input end (−) is less than 0 V with respect to 0 V of the node B, so the signal Cout is at the H level.

In addition, by turning on the switch Trd_1, a charge accumulated in the capacitance element Cs_1 for testing is reset to zero.

Figure 8:
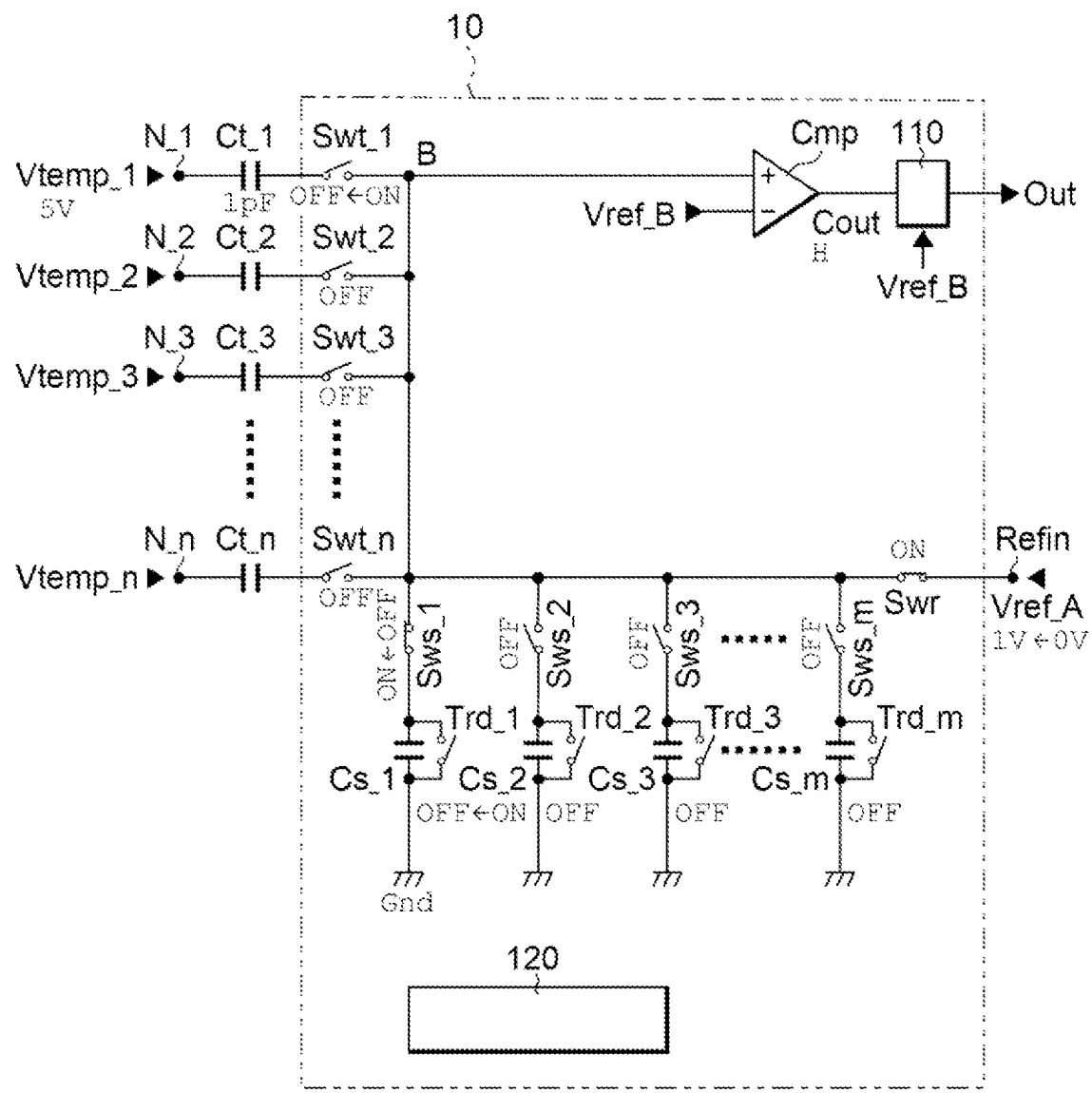
FIG. 8 is a diagram illustrating operation of the test circuit.

In the second period after the first period, as illustrated in FIG. 8, the control circuit 120 turns off the switch Swt_1, turns on the switch Sws_1, and turns off the switch Trd_1. Further, the control circuit 120 changes the voltage of the signal Vref_A from 0 V to 1 V. A charge of 10 fC is accumulated in the capacitance element Cs_1 for testing by turning on the switch Sws_1.

Note that, in the second period, the signal Cout is maintained at the H level.

Figure 9:
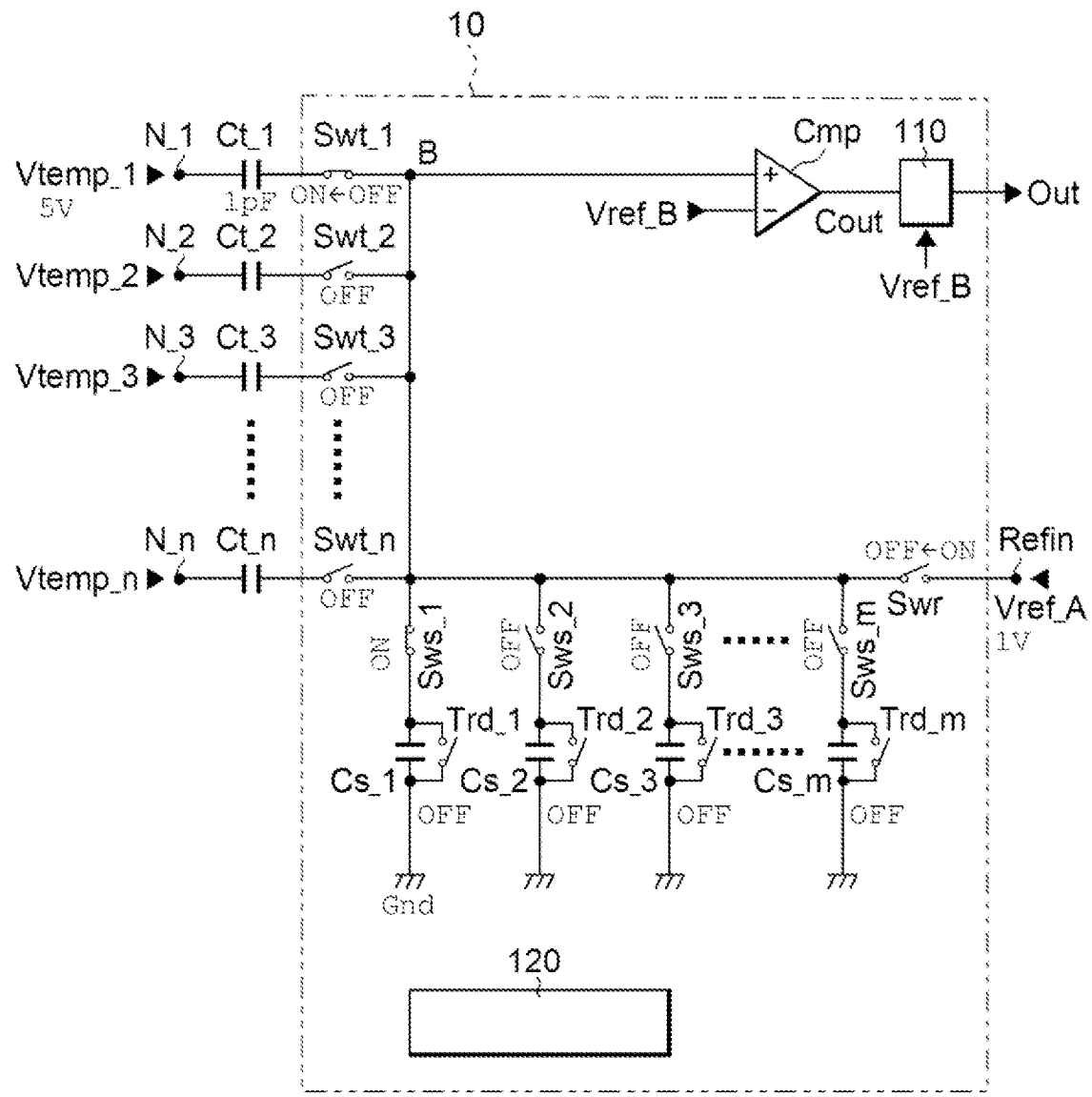
FIG. 9 is a diagram illustrating the operation of the test circuit.

In the third period after the second period, the control circuit 120 turns on the switch Swt1 after turning off the switch Swr, as illustrated in FIG. 9. In addition, the control circuit 120 gradually raises and changes the signal Vref_B from a voltage equal to or greater than 0 V.

Other operations are similar to those in the second exemplary embodiment, and the determination circuit 110 determines an actual capacity size of the capacitance element Ct_1 to be tested by substituting the voltage b of the signal Vref_B when the signal Cout is inverted from the H to L level in the third period into Equation (3) above.

Note that, the third exemplary embodiment is also the same as the first exemplary embodiment and the second exemplary embodiment in that the capacitance elements to be tested as the test targets are selected one at a time, and that the capacitance element for testing is selected in accordance with the capacity size of the capacitance element to be tested as the test target.

In addition, the capacity size of the capacitance element to be tested selected as the test target is tested together with the parasitic capacitor of the node B as in the case in the first exemplary embodiment and the second exemplary embodiment.

According to the third exemplary embodiment, the capacity size of each of the capacitance elements Cs_1 to Cs_m for testing can be smaller than the capacity size of the capacitance element to be tested selected as the capacitance element to be tested test target, thus an area of the semiconductor substrate can be prevented from being too large.

Fourth Exemplary Embodiment

In the first exemplary embodiment to the third exemplary embodiment, when a capacity size of one capacitance element to be tested is tested, it has been necessary to repeat the first period and the second period two or more times, or to change the voltage of the signal Vref_B. Next, a fourth exemplary embodiment will be described in which the voltage of the signal Vref_B need not be changed in a first period and a second period in testing a capacity size of a capacitance element to be tested.

Figure 10:
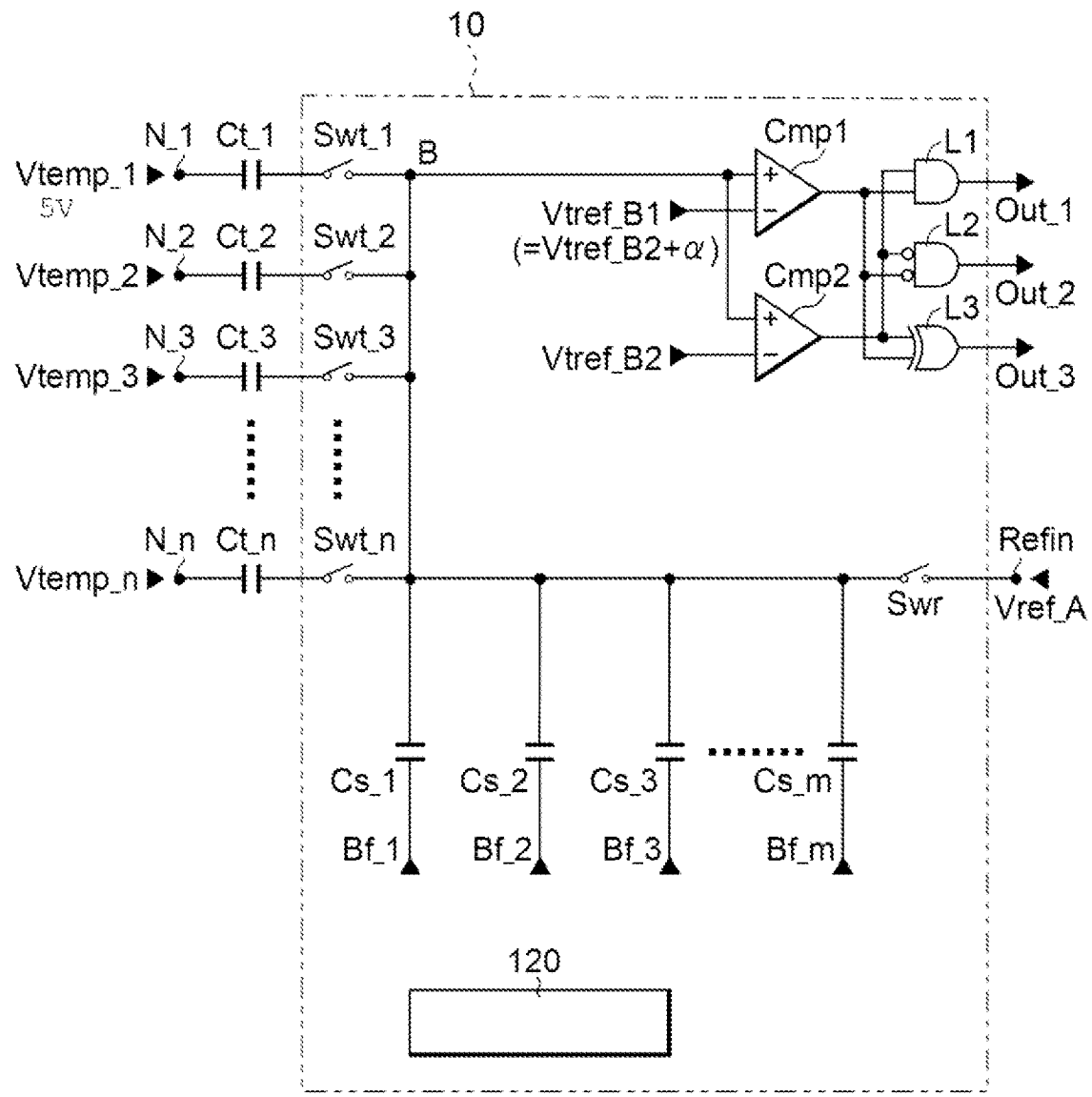
FIG. 10 is a circuit diagram of a periphery of an integrated circuit according to a fourth exemplary embodiment, including a test circuit.

FIG. 10 is a circuit diagram of a periphery of an integrated circuit according to the fourth exemplary embodiment, including the test circuit 10. The fourth exemplary embodiment is different from the first exemplary embodiment illustrated in FIG. 1 in that an AND circuit L1, an NOR circuit L2, and an EX-OR circuit L3 are added, and that the comparison circuit Cmp includes comparators Cmp1 and Cmp2.

A positive input end (+) of the comparator Cmp1 and a positive input end (+) of the comparator Cmp2 are electrically connected to the node B. A signal Vref_B1 is supplied to a negative input end (−) of the comparator Cmp1, and a signal Vref_B2 is supplied to a negative input end (−) of the comparator Cmp2. The comparators Cmp1 and Cmp2 each output a signal at the H level when a voltage applied to the positive input end (+) is equal to or greater than a voltage applied to the negative input end (−), and each output a signal at the L level when the voltage applied to the positive input end (+) is less than the voltage applied to the negative input end (−).

Note that, the comparator Cmp1 is an example of a first comparator, and the comparator Cmp2 is an example of a second comparator. A voltage of the signal Vref_B1 and a voltage of the signal Vref_B2 are temporally and substantially constant, and the voltage of the signal Vref_B1 is higher than the voltage of the signal Vref_B2 by α.

Note that, the voltage of the signal Vref_B1 and the voltage of the signal Vref_B2 are each a voltage of a property defined by an upper limit and a lower limit of a range of a capacity size to be satisfied by a capacitance element to be tested. The voltage of the signal Vref_B1 is an example of a first reference voltage, and the voltage of the signal Vref_B2 is an example of a second reference voltage.

Additionally, an output signal of the comparator Cmp1 is an example of a first comparison result signal, and an output signal of the comparator Cmp2 is an example of a second comparison result signal.

The AND circuit L1 determines a logical AND of an output signal of the comparator Cmp1 and an output signal of the comparator Cmp2, and outputs the logical AND as a signal Out1. The NOR circuit L2 determines a negative OR of an output signal of the comparator Cmp1 and an output signal of the comparator Cmp2, and outputs the negative OR as a signal Out2. The EX-OR circuit L3 determines an exclusive OR of an output signal of the comparator Cmp1 and an output signal of the comparator Cmp2, and outputs the exclusive OR as a signal Out3.

Note that, a power supply voltage for the comparators Cmp1, Cmp2, the AND circuit L1, the NOR circuit L2, and the EX-OR circuit L3 may be a low voltage (for example, 1.8 V), although not particularly illustrated.

In such a configuration, when a voltage of the node B in the second period is less than the voltage of the signal Vref_B2, the signal Out2 is at the H level, and the signals Out1 and Out3 are at the L level. In other words, in the second period, the signal Out2 being at the H level indicates that an actual capacity size of a capacitance element to be tested selected as a test target is greater than an upper limit of a range of a capacity size to be satisfied (an upper limit corresponding to the voltage of the signal Vref_B1).

In addition, when the voltage of the node B in the second period is equal to or greater than the voltage of the signal Vref_B2 and less than the voltage of the signal Vref_B1, the signal Out3 is at the H level, and the signals Out1 and Out2 are at the L level. In other words, in the second period, the signal Out3 being at the H level indicates that an actual capacity size of a capacitance element to be tested selected as a test target falls in a range of a capacity size to be satisfied.

When the voltage of the node B in the second period is equal to or greater than the voltage of the signal Vref_B1, the signal Out1 is at the H level, and the signals Out2 and Out3 are at the L level. In other words, in the second period, the signal Out1 being at the H level indicates that an actual capacity size of a capacitance element to be tested selected as a test target is less than a lower limit of a range of a capacity size to be satisfied (a lower limit corresponding to the voltage of the signal Vref_B2).

Note that, parasitic capacitance of the node B in the fourth exemplary embodiment is the same as that of the first to third exemplary embodiments.

Fifth Exemplary Embodiment

The voltages of the respective signals Vref_B1 and Vref_B2 in the second exemplary embodiment are generated, for example, in accordance with a fifth exemplary embodiment.

Figure 11:
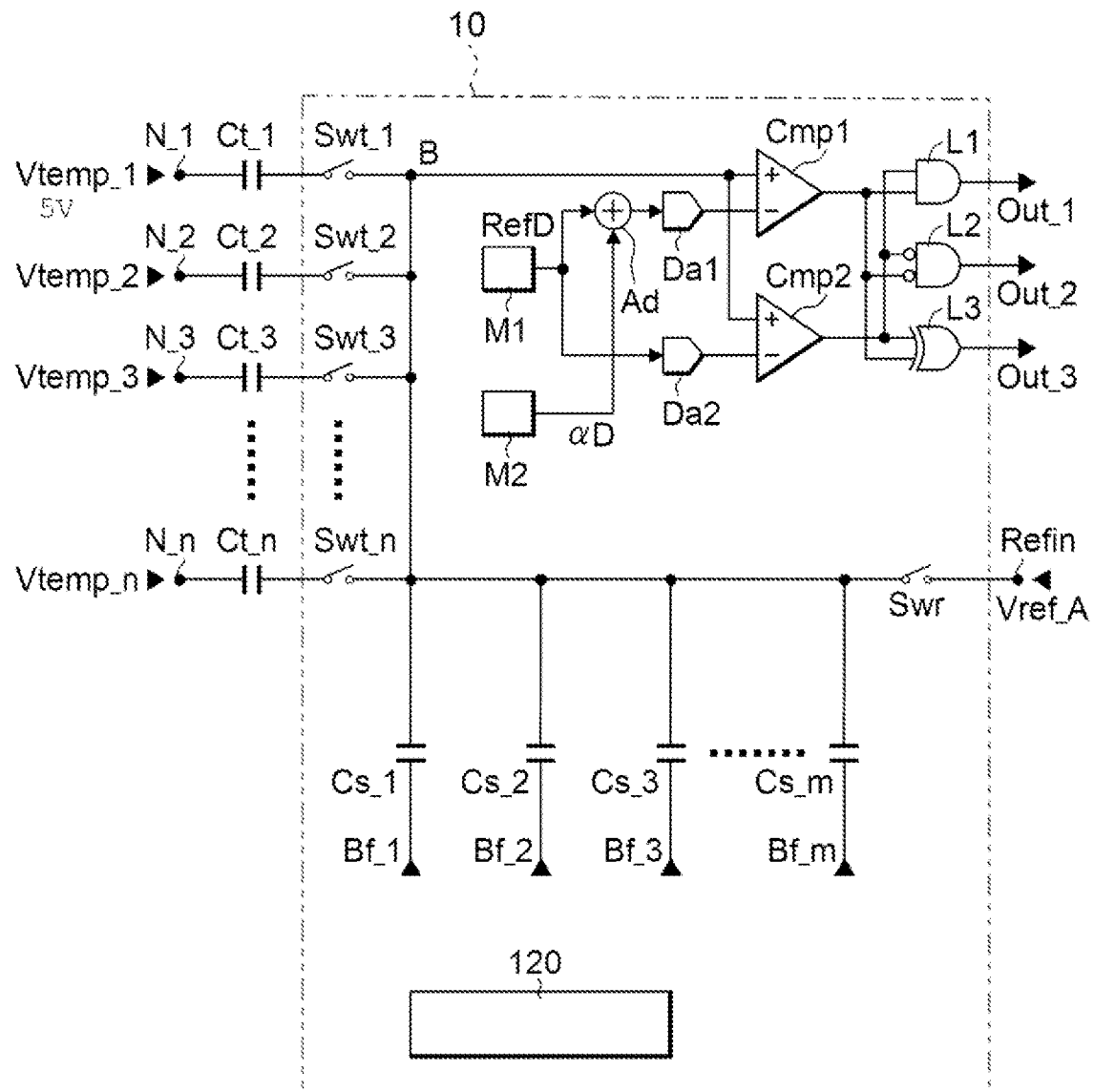
FIG. 11 is a circuit diagram of a periphery of an integrated circuit according to a fifth exemplary embodiment, including a test circuit.

FIG. 11 is a circuit diagram of a periphery of an integrated circuit according to the fifth exemplary embodiment, including the test circuit 10. In the fifth exemplary embodiment, storage circuits M1, M2, an adder Ad, DA converters Da1 and Da2 are included, compared to the fourth exemplary embodiment illustrated in FIG. 10.

The storage circuit M1 stores data RefD indicating voltage data of the signal Vref_B2.

The storage circuit M2 stores data aD indicating an offset value of the voltage of the signal Vref_B2, in particular a voltage corresponding to a.

The adder Ad adds the data RefD and the data aD. The DA converter Da1 converts data output from the adder Ad to the signal Vref_B1, which is analog, and supplies the signal Vref_B1 to a negative input end (−) of the comparator Cmp1. The DA converter Da2 converts the data RefD to the signal Vref_B2, which is analog, and supplies the signal Vref_B2 to a negative input end (−) of the comparator Cmp2.

Note that, in the fifth exemplary embodiment, the configuration is adopted in which as the voltage of the signal Vref_B1, the data αD indicating the voltage corresponding to a is added to the data RefD indicating the voltage of the signal Vref_B2, and output data indicating the added value is converted to analog, but the present disclosure is not limited to this configuration. For example, a configuration may be adopted in which as the voltage of the signal Vref_B2, data corresponding to −α is added to the data RefD indicating the voltage of the signal Vref_B1, and the added value is converted to analog. That is, in the present description, the adder is used in a sense that includes not only addition, but also subtraction.

In the fifth exemplary embodiment, the data RefD and the data αD can be changed as appropriate. Thus, according to the fifth exemplary embodiment, an assumed (tolerated) capacity range can be easily changed, compared to a configuration in which the DA converters Da1 and Da2 are not used. Further, in the fifth exemplary embodiment, even when there is a variation in output characteristics of the DA converters Da1 and Da2, by appropriately correcting the data RefD and the data αD, effects of the variation can be suppressed to be small.

In addition, in the fourth or fifth exemplary embodiment, the configuration has been adopted in which, with the two comparators and the three logic circuits, specifically, with the comparators Cmp1, Cmp2, the AND circuit L1, the NOR circuit L2, and the EX-OR circuit L3, it is tested that the voltage of the node B is in a range of equal to or greater than the voltage of the signal Vref_B2 and less than the voltage of signal Vref_B1, or when the voltage is out of the range, it is tested that the voltage is higher or lower than the range. The present disclosure is not limited to this configuration, and a configuration may be adopted in which the number of comparators and logic circuits is increased, and it is determined that the voltage is included in any of a plurality of voltage ranges or, when the range is out of the plurality of voltage ranges, it is determined whether the voltage is lower or higher than the ranges.

Note that, parasitic capacitance of the node B in the fifth exemplary embodiment is the same as that of the fourth exemplary embodiment.

Sixth Exemplary Embodiment

In the test circuit 10, the configuration has been adopted in which the voltage change of the node B is determined by the comparison circuit Cmp and the like, but in such a configuration, it may be necessary to output the voltage of the node B to an outside of the integrated circuit. Next, a sixth exemplary embodiment will be described in which the voltage of the node B is output to the outside.

Figure 12:
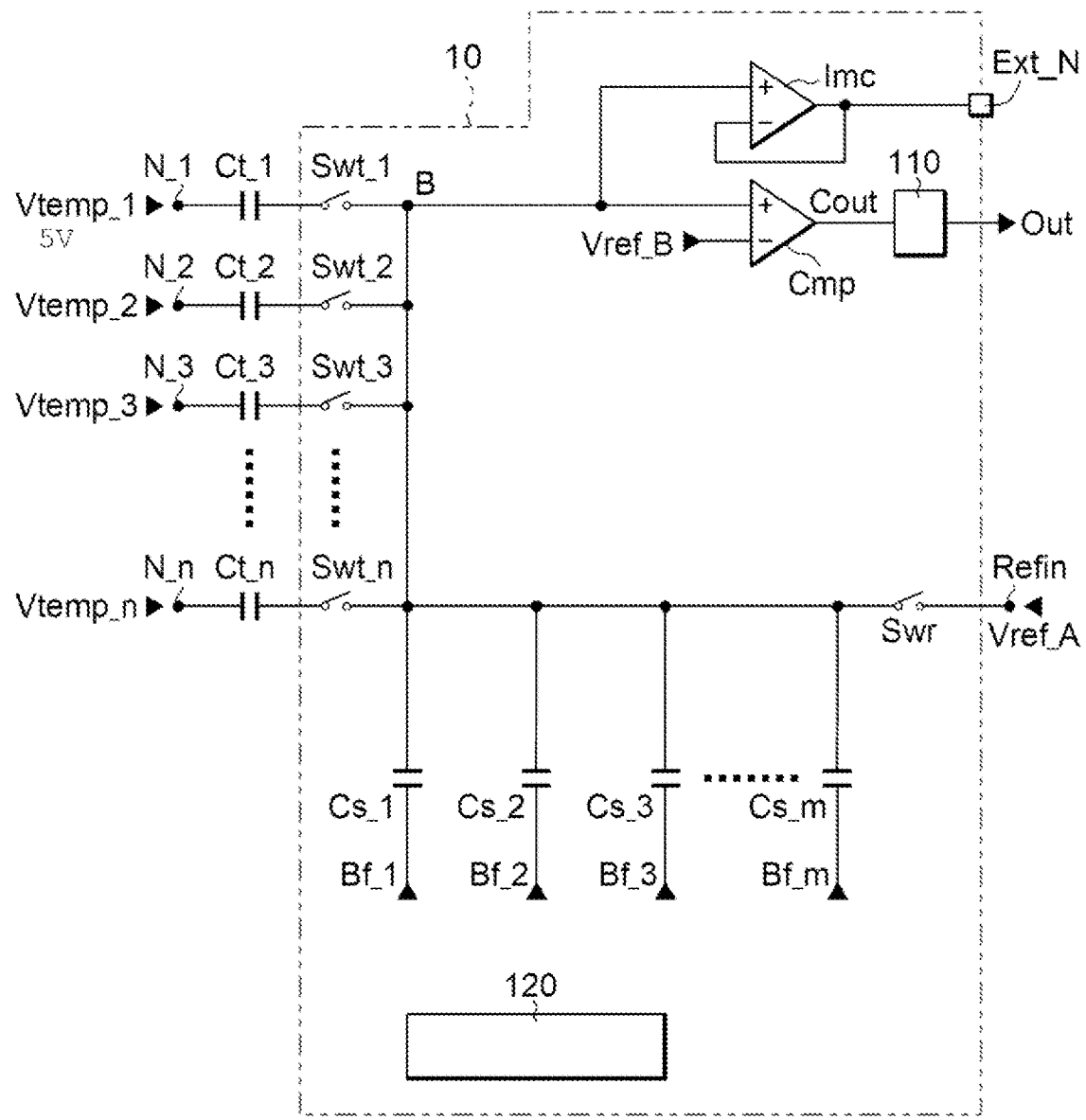
FIG. 12 is a circuit diagram of a periphery of an integrated circuit according to a sixth exemplary embodiment, including a test circuit.

FIG. 12 is a circuit diagram of a periphery of an integrated circuit according to the sixth exemplary embodiment, including the test circuit 10. In the sixth exemplary embodiment, compared to the first exemplary embodiment illustrated in FIG. 1, an impedance converter Imc is included, and a terminal Ext_N is provided. The impedance converter Imc is, for example, a non-inverting amplification circuit. Specifically, a positive input end (+) of the impedance converter Imc is electrically connected to the node B, and an output end is electrically connected to the terminal Ext_N and a negative input end (−). The terminal Ext_N is a terminal for outputting to an outside of the integrated circuit.

According to the sixth exemplary embodiment, even relatively high impedance at the node B is converted to relatively low impedance by the impedance converter Imc and output to the terminal Ext_N. Thus, when the terminal Ext_N is electrically connected to a meter or the like separate from the integrated circuit, a circuit electrically connected to the node B before the comparison circuit Cmp can be checked based on the voltage of the node B output from the terminal Ext_N.

Seventh Exemplary Embodiment

Figure 13:
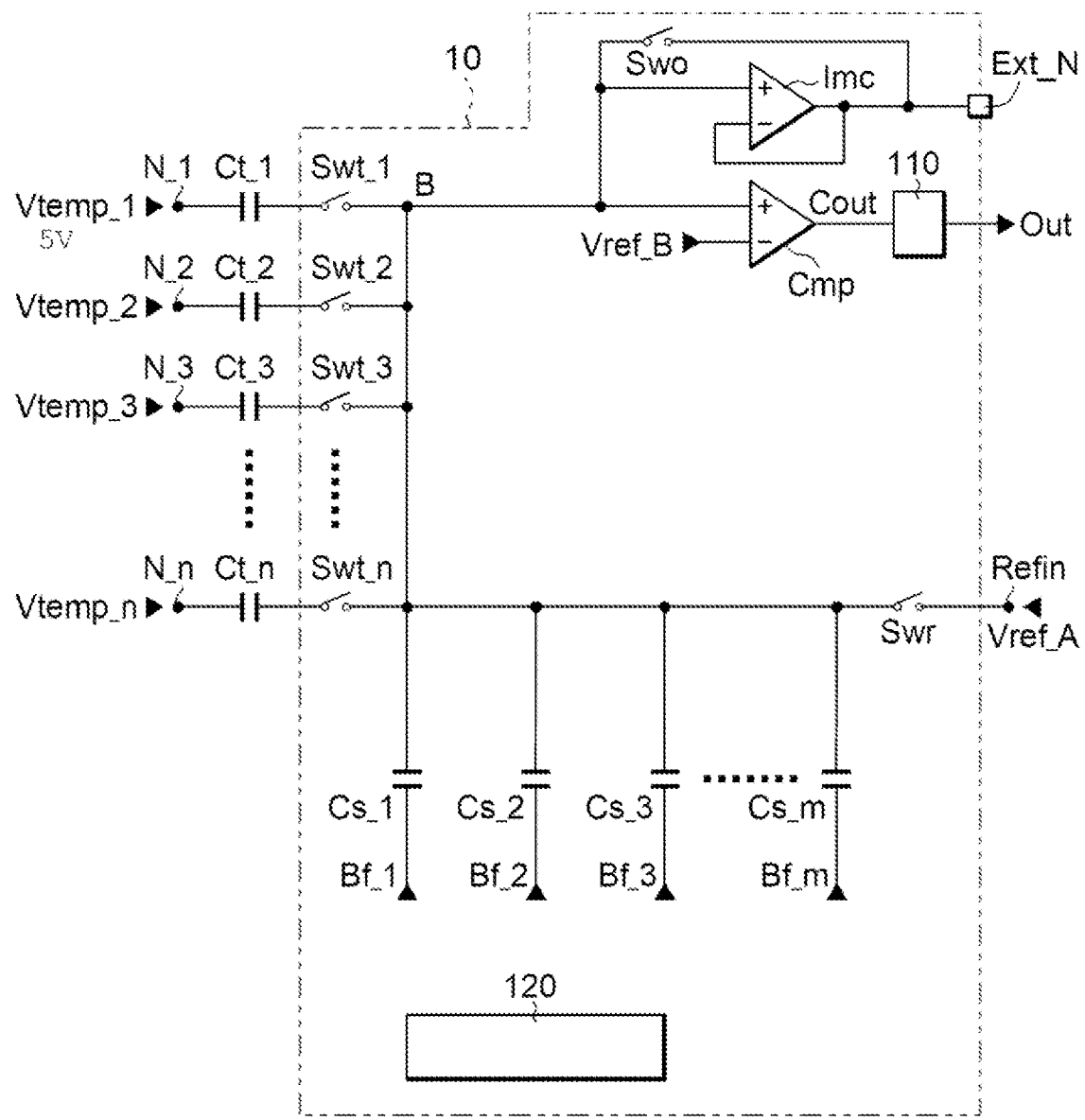
FIG. 13 is a circuit diagram of a periphery of an integrated circuit according to a seventh exemplary embodiment, including a test circuit.

FIG. 13 is a circuit diagram of a periphery of an integrated circuit according to a seventh exemplary embodiment, including a test circuit 10. In the seventh exemplary embodiment, a switch Swo is provided in comparison to the sixth exemplary embodiment illustrated in FIG. 12. Specifically, the switch Swo is provided between the node B and the terminal Ext_N, and is controlled to be on or off by the control circuit 120.

When the switch Swo is off, a voltage of the node B is output to the terminal Ext_N in the same manner as in the sixth exemplary embodiment. Thus, when the terminal Ext_N is electrically connected to a meter or the like separate from the integrated circuit, a circuit electrically connected to the node B before the comparison circuit Cmp can be checked based on the voltage of the node B output from the terminal Ext_N.

On the other hand, when the switch Swo is on, a predetermined voltage can be applied to the node B via the terminal Ext_N by a meter or the like separate from the integrated circuit. Therefore, a circuit electrically connected after the comparison circuit Cmp can be checked by the meter or the like.

Eighth Exemplary Embodiment

Figure 14:
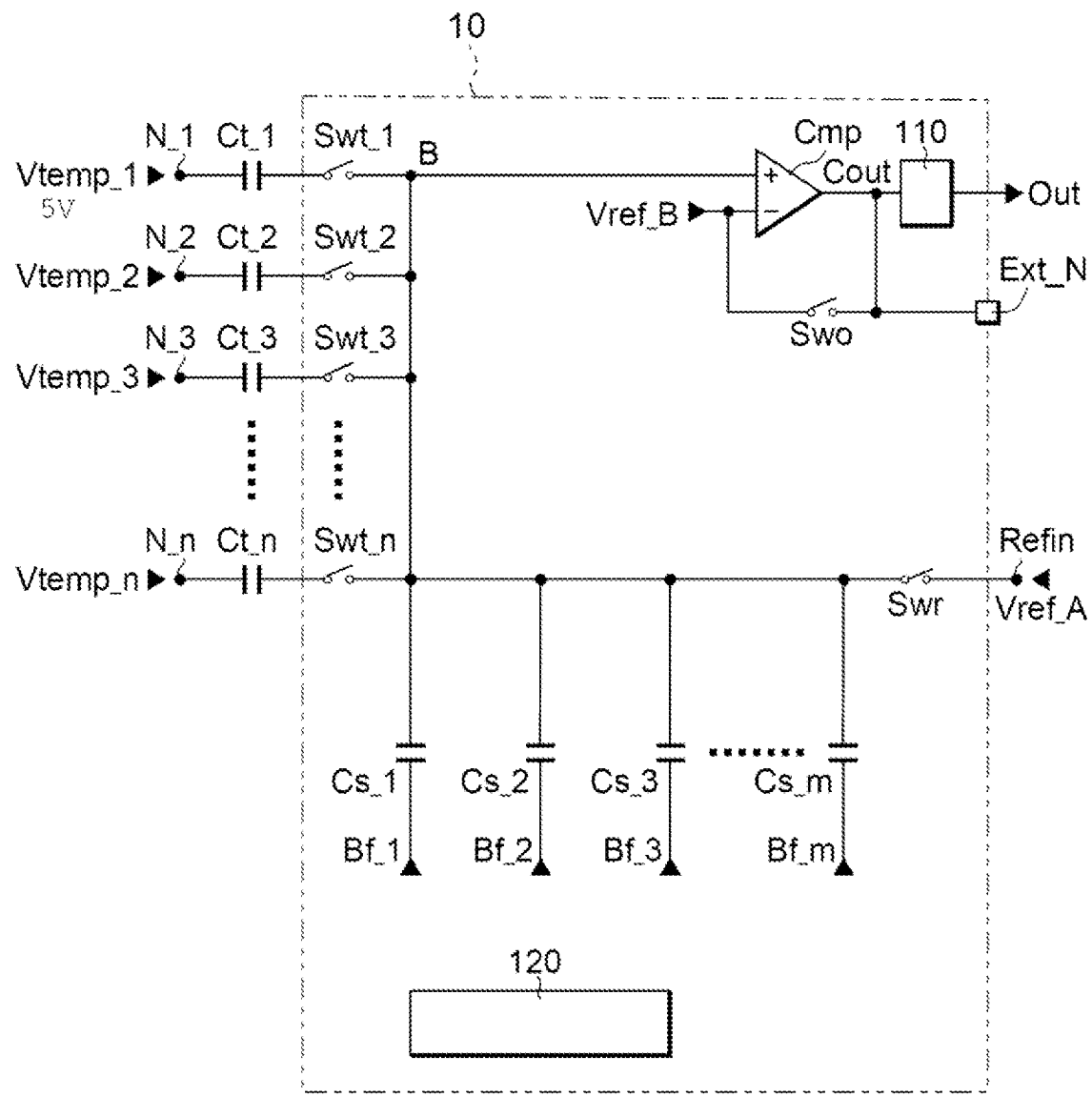
FIG. 14 is a circuit diagram of a periphery of an integrated circuit according to an eighth exemplary embodiment, including a test circuit.

FIG. 14 is a circuit diagram illustrating the test circuit 10 and the like of an integrated circuit according to an eighth exemplary embodiment.

In the eighth exemplary embodiment, the switch Swo and the terminal Ext_N are provided compared to the first exemplary embodiment illustrated in FIG. 1. The switch Swo is provided between a negative input end (−) of the comparison circuit Cmp and an output end of the comparison circuit Cmp, and is controlled to be on or off by the control circuit 120. Furthermore, the terminal Ext_N is a terminal for outputting to an outside of the integrated circuit, or a terminal for inputting a signal from the outside, and is electrically connected to an output end of the comparison circuit Cmp.

When the switch Swo is on in such a configuration, the comparison circuit Cmp functions as a non-inverting amplification circuit in the same manner as in the sixth exemplary embodiment. Thus, the terminal Ext_N can be electrically connected to a meter or the like separate from the integrated circuit, a circuit electrically connected to the node B before the comparison circuit Cmp can be checked by the meter or the like based on the voltage of the node B output from the terminal Ext_N.

Application Example to Display Device

Next, a display device to which an integrated circuit including the test circuit 10 is applied will be described.

Figure 15:
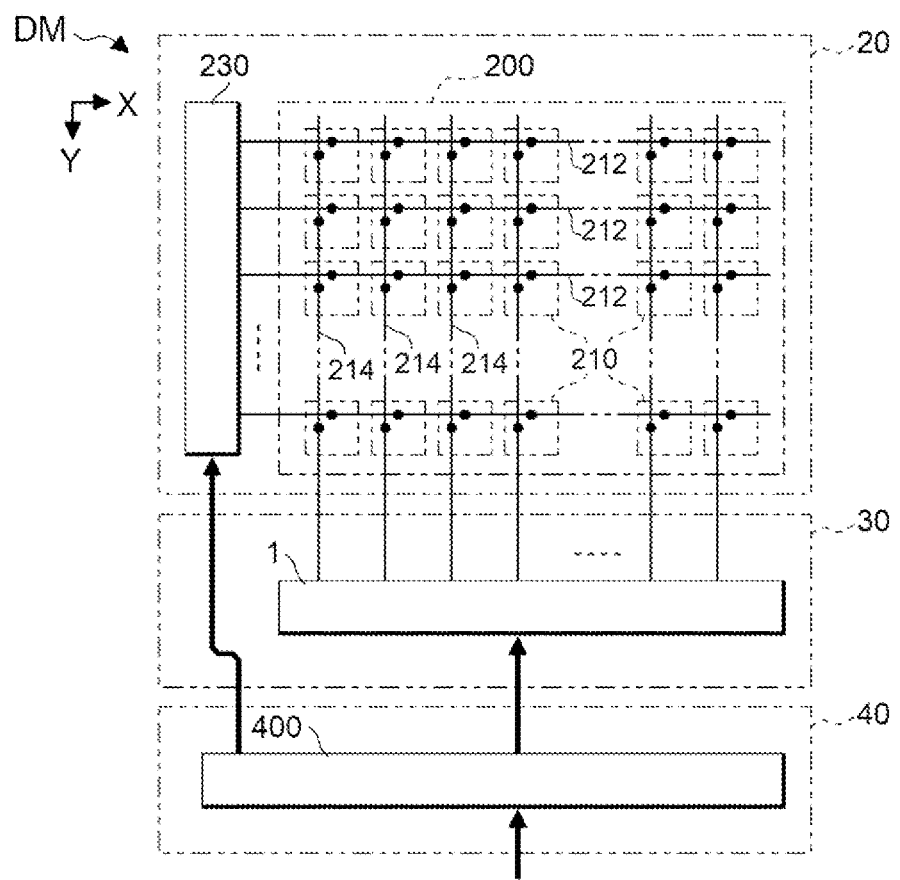
FIG. 15 is a diagram illustrating an electrical configuration of a display device.
Figure 16:
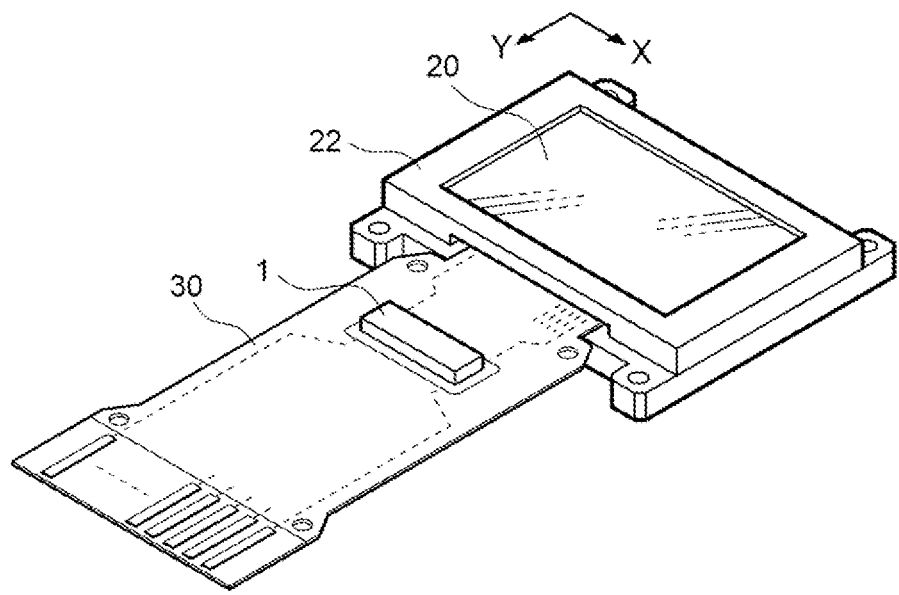
FIG. 16 is a perspective view illustrating the display device to which an integrated circuit is applied.
Figure 17:
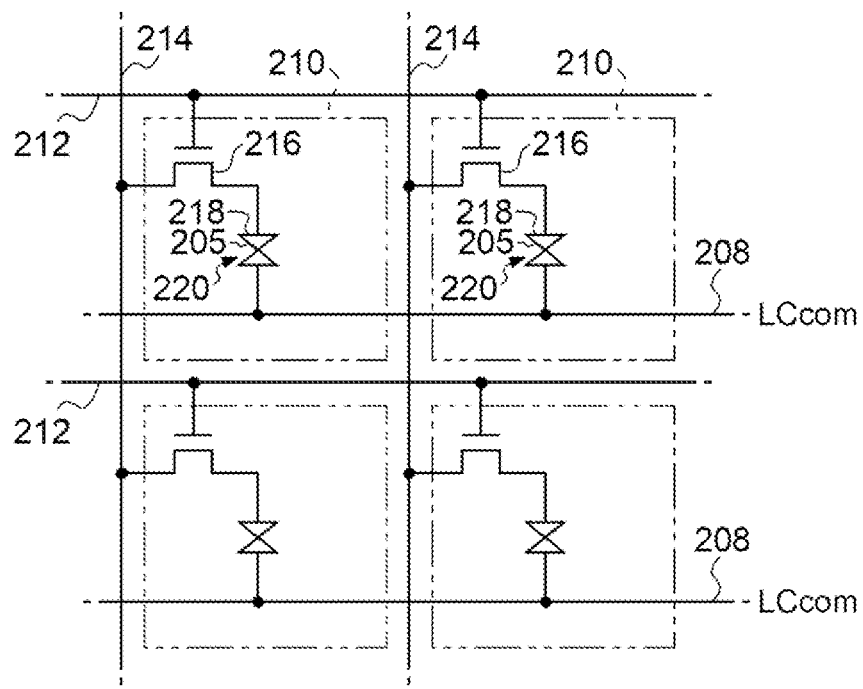
FIG. 17 is a diagram illustrating a configuration of a pixel circuit in the display device.

FIG. 15 is a block diagram illustrating an electrical configuration of a display device DM, and FIG. 16 is a perspective view illustrating a configuration in which a printed circuit board 40 is removed from the display device DM, and FIG. 17 is a diagram illustrating a configuration of a pixel circuit 210 in a liquid crystal panel 20.

As illustrated in FIG. 15, the display device DM includes the liquid crystal panel 20, an FPC board 30, and the printed circuit board 40. Note that FPC is an abbreviation for Flexible Printed Circuits.

The liquid crystal panel 20 is of a transmission type used as a light valve of a liquid crystal projector, for example. In the liquid crystal panel 20, a Y driver 230 is provided on a periphery of a display region 200. In the display region 200, the pixel circuits 210 corresponding to pixels of an image to be displayed are arrayed in a matrix. More specifically, in the display region 200, a plurality of scanning lines 212 are provided extending in an X direction in the figure, and a plurality of data lines 214 extend in a Y direction, and are provided so as to be mutually and electrically insulated from the scanning lines 212. Then, the pixel circuits 210 are provided corresponding to intersections of the plurality of scanning lines 212 and the plurality of data lines 214.

When the number of scanning lines 212 is m and the number of data lines 214 is n, the pixel circuits 210 are arrayed in a matrix in vertical m rows and horizontal n columns. Any of n and m is an integer equal to or greater than 2. For the scanning lines 212 and the pixel circuits 210, in order to distinguish the rows in the matrix from each other, the rows may be referred as 1, 2, 3, . . . , (m−1), and m row in order from the top in the figure. Similarly, for the data lines 24 and the pixel circuits 210, in order to distinguish the columns in the matrix from each other, the columns may be referred as 1, 2, 3, . . . , (n−1), and n column in order from the left in the figure.

The Y driver 230 selects the scanning lines 212 one by one in the order of, for example, 1st, 2nd, 3rd, . . . , m-th rows, according to a control signal supplied via the FPC board 30, and sets a scanning signal to the selected scanning line 212 to the H level. Note that, the Y driver 230 sets a scanning signal to the scanning line 212 other than the selected scanning line 212 to the L level.

For convenience of explanation, a configuration of the pixel circuit 210 will be described.

As illustrated in FIG. 17, the pixel circuit 210 includes a transistor 216 and a liquid crystal element 220. The transistor 216 is, for example, an n-channel type thin film transistor. In the pixel circuit 210, a gate node of the transistor 216 is electrically connected to the scanning line 212. A source node of the transistor 216 is electrically connected to the data line 214. A drain node of the transistor 216 is electrically connected to a pixel electrode 218 patterned in a substantially square shape in plan view.

A common electrode 208 is provided commonly for all the pixels so as to face the pixel electrode 218. A voltage LCcom is applied to the common electrode 208. Then, a liquid crystal 205 is sandwiched between the pixel electrode 218 and the common electrode 208. Accordingly, the liquid crystal element 220 is configured with the pixel electrode 218, the common electrode 208, and the liquid crystal 205 for each pixel circuit 210.

As described below, in a horizontal scanning period in which a scanning signal to one scanning line 212 is at the H level, a data line driving circuit 240 supplies a data signal of a voltage corresponding to a gradation of a pixel to be represented by the pixel circuit 210 to the data line 214 corresponding to the pixel circuit 210 toward the pixel circuit 210 positioned at the scanning line 212.

In the scanning line 212 in which the scanning signal is at the H level, the transistor 216 of the pixel circuit 210 provided corresponding to the scanning line 212 is on. By turning on the transistor 216, the data line 214 and the pixel electrode 218 are brought into a state of electrically connected, thus the data signal supplied to the data line 24 reaches the pixel electrode 218 via the transistor 216 being on. When the scanning line 212 is at the L level, the transistor 116 is off, but a voltage of the data signal reaching the pixel electrode 118 is held by a capacitive property of the liquid crystal element 220.

As is well known, in the liquid crystal element 220, an oriented state of the liquid crystal 205 varies in accordance with an electric field generated by the pixel electrode 218 and the common electrode 208. Accordingly, the liquid crystal element 220 has a transmittance (optical state) in accordance with an effective value of an applied voltage. Thus, in the liquid crystal panel 20, a transmittance varies for each liquid crystal element 220 of the pixel circuit 210.

By performing a voltage holding operation on the liquid crystal elements 220 in the order of 1st, 2nd, 3rd, . . . , m-th rows, the voltage corresponding to the data signal is held for each of the liquid crystal elements 220 in the pixel circuits 210 arrayed in m rows and n columns. By such voltage holding results in a target transmittance for each liquid crystal element 220, and an image formed of pixels arrayed in m rows and n columns is generated.

As illustrated in FIG. 16, an integrated circuit 1 is a substantially cuboid shaped semiconductor chip, and is mounted to the FPC board 30 by face-down bonding. The liquid crystal panel 20 is housed in a frame-shaped case 22 opening in the display region.

One end of the FPC board 30 is electrically connected to the liquid crystal panel 20. Another end of the FPC board 30 is electrically connected to the printed circuit board 40.

Returning the description back to FIG. 15, the printed circuit board 40 includes a control circuit 400. Gradation data and a synchronization signal are input in the control circuit 400 from an upper circuit (not illustrated). The gradation data specifies digitally, for example with 8 bits, a gradation level of a pixel in an image to be displayed.

The control circuit 400 supplies a control signal generated based on the synchronization signal to the Y driver 230 via the FPC board 30.

Further, the control circuit 400 supplies the control signal generated in accordance with the gradation data and the synchronization signal to the integrated circuit 1.

In addition to the test circuit 10 according to any of the first to eighth exemplary embodiments described above, the integrated circuit 1 includes a driver circuit that generates gradation data for one row as analog data signals, and supplies the signals to each of the data lines 214. The driver circuit includes a capacitance element to be tested serving as a test target.

Figure 18:
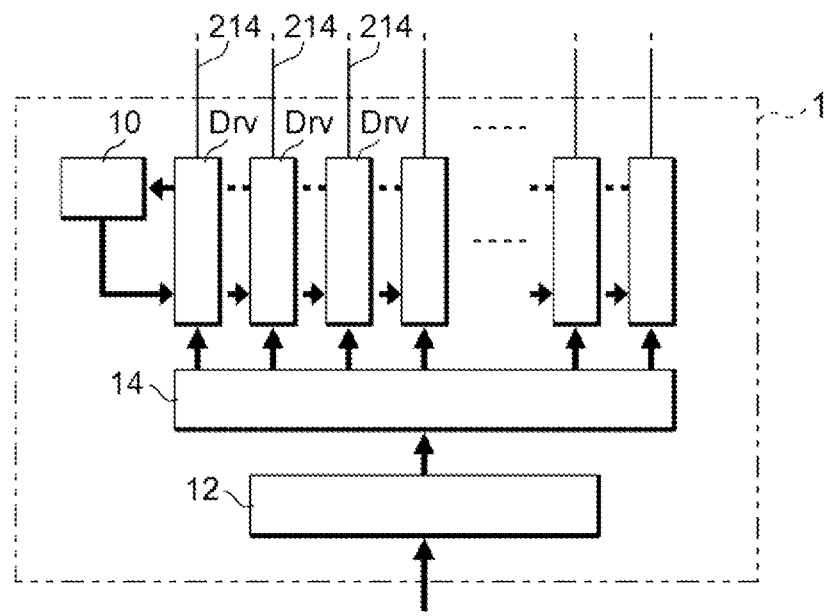
FIG. 18 is a diagram illustrating a configuration of the integrated circuit in the display device.

FIG. 18 is a block diagram illustrating a configuration of the integrated circuit 1. The integrated circuit 1 includes the test circuit 10 according to any of the first to eighth exemplary embodiments described above, a plurality of driver circuits Drv, a data input circuit 12, and a data controller 14.

The driver circuits Dry are provided in a one-to-one correspondence with the data lines 214. When the number of data lines 214 is n, which is plural, the number of driver circuits Dry is also n, which is plural.

The data input circuit 12 is an interface for inputting gradation data and a synchronization signal supplied from the control circuit 400 via the FPC board 30. The data controller 14 distributes the gradation data supplied via the data input circuit 12 to the n driver circuits Dry according to the synchronization signal supplied via the data input circuit 12.

The n driver circuits Dry are arrayed along a long side of the integrated circuit 1. As illustrated in FIG. 15 and FIG. 16, the integrated circuit 1 is mounted to the FPC board 30 so that the long side of the integrated circuit 1 is along the X direction, which is an extension direction of the scanning line 212, thus the n driver circuits Dry are also provided along the extension direction of the scanning line 212. Note that, the X direction, which is the extension direction of the scanning line 212, is an example of a predetermined direction.

The test circuit 10 is provided next to a region in the integrated circuit 1 where the n driver circuits Dry provided along the extension direction of the scanning line 212 are arrayed. The test circuit 10 tests a capacity size of a capacitance element to be tested included in each of the n driver circuits Drv, and adjusts parameters in each of the n driver circuits Dry based on the tested capacity size. Note that, examples of the parameters will be described below.

One driver circuit Dry latches gradation data supplied corresponding to a column of the driver circuit Drv, and converts the gradation data to an analog data signal. Note that, the respective n driver circuits Dry output the converted data signal all at once in accordance with selection of the scanning line 212 by the Y driver 230.

Figure 19:
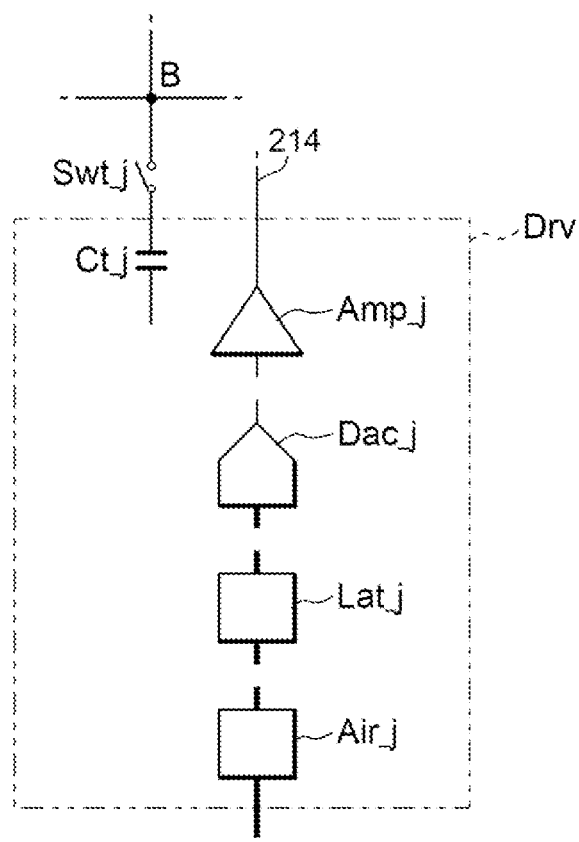
FIG. 19 is a diagram illustrating a configuration of a driver circuit in the integrated circuit.

FIG. 19 is a diagram illustrating a schematic configuration of the driver circuit Dry provided corresponding to the data line 214 in a j-th column. The driver circuit Dry includes an arithmetic circuit Air_j, a latch circuit Lat_j, a DA converter circuit Dac_j, and an amplification circuit Amp_j.

The arithmetic circuit Air_j performs operations and the like on gradation data supplied corresponding to the j-th column. Examples of the operations and the like include a conversion to data suitable for the liquid crystal panel 100, four arithmetic operations for suppressing variations, and the like.

The latch circuit Lat_j latches the gradation data subjected to the operations and the like, until the scanning line 212 is selected by the Y driver 230.

The DA converter circuit Dac_j converts the latched gradation data to an analog signal.

The amplification circuit Amp_j amplifies the signal converted to analog as appropriate, and outputs the signal as a data signal toward the data line 214 in the j-th column.

Note that in FIG. 19, the reason why the elements, that is, the arithmetic circuit Air_j, the latch circuit Lat_j, the DA converter circuit Dac_j, and the amplification circuit Amp_j, are not electrically connected to each other is to indicate that another element may be interposed between these elements.

Examples of a capacitance element Ct to be tested in the driver circuit Dry include a capacitance element included in the DA converter circuit Dac_j. Specifically, the DA converter circuit Dac_j can be configured by a driver described in JP 2016-80805 A or a driver described in JP 2016-90882 A, and various capacitors constituting these drivers, and the like, can be used as capacitance elements to be tested.

As a result, the number of the capacitance elements to be tested in one driver circuit Dry is one or more.

The test circuit 10 selects the n driver circuits Dry one at a time in order, further selects capacitance elements included in the selected driver circuit Dry one at a time in a predetermined order as test targets, and tests a capacity size of the selected capacitance element.

Then, the control circuit 120 in the test circuit 10 adjusts parameters of the driver circuit Dry selected according to the capacity size tested.

Specifically, when the driver circuit Dry in the j-th column is selected and a capacitance element included in the driver circuit Dry is selected as a test target, the control circuit 120 adjusts, in accordance with a capacity size of the capacitance element, parameters specifying operational contents of the arithmetic circuit Air_j included in the driver circuit Dry in the j-th column, gain of the amplification circuit Amp_j, a reference current, a reference voltage, and the like in these elements.

Note that, examples of a period in which the control circuit 120 performs testing include, as for a display period, a period in which display is not affected, specifically, a horizontal scan blanking period and a vertical scan blanking period. The horizontal scan blanking period is a period from an end of selection of one scanning line 212 to a start of selection of next one scanning line 212. The vertical scan blanking period is a period from an end of selection of the last scanning line 212 in one frame to a start of selection of the initial scanning line 212 in the next frame.

In general, since the vertical scan blanking period is longer than the horizontal scan blanking period, it is possible to continuously test capacity sizes of more capacitance elements in the vertical scan blanking period than in the horizontal scan blanking period.

In addition, in the display device DM illustrated in FIG. 15, the configuration is adopted in which the driver circuits Dry in a one-to-one correspondence with the data lines 214 supply data signals to the data lines 214, but the present disclosure is not limited to this configuration. For example, a configuration may be adopted in which one driver circuit Dry is associated with the k data lines 214, and data signals are supplied in a time-division manner to the k data lines 214 in one horizontal scanning period. Note that, k is an integer equal to or greater than 2.

Figure 20:
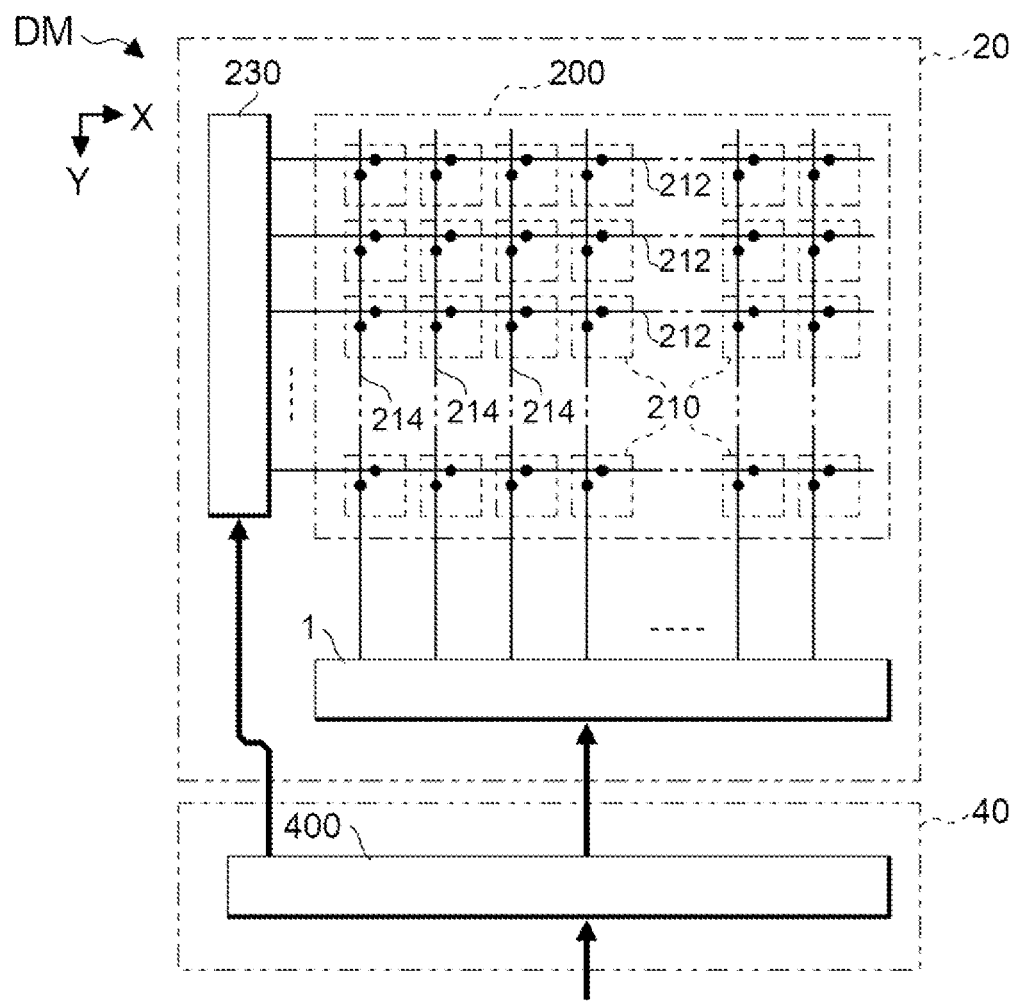
FIG. 20 is a diagram illustrating an electrical configuration of another display device.

In addition, in the display device DM illustrated in FIG. 15, the configuration has been adopted in which the integrated circuit 1 is mounted to the FPC board 30, and the liquid crystal panel 20 and the integrated circuit 1 are separately formed, but the present disclosure is not limited to this configuration. For example, as illustrated in FIG. 20, a configuration may be adopted in which a function of the integrated circuit 1 is transferred to the liquid crystal panel 20. Specifically, an element substrate in the liquid crystal panel 20 may be a semiconductor substrate, and the function of the integrated circuit 1 may be imparted to the semiconductor substrate.

The display device DM can be applied not only to the liquid crystal panel 100, but also to an organic EL panel using an OLED. In the organic EL panel, a configuration may be used in which the function of the integrated circuit 1 described above is imparted to a semiconductor substrate constituting the organic EL panel.

What is claimed is:

1. An integrated circuit, comprising:
a capacitance element to be tested having one end to which a predetermined voltage is supplied; and
a test circuit including a capacitance element for testing and a comparison circuit for comparing a voltage of an input node of the comparison circuit with a predetermined reference voltage supplied to another node of the comparison circuit, and configured to electrically connect another end of the capacitance element to be tested to the input node of the comparison circuit to:
apply a first voltage to the input node of the comparison circuit in a first period while the first voltage is also applied to one end of the capacitance element for testing and the first voltage is different from the predetermined voltage supplied to the one end of the capacitance element to be tested,
apply, in a second period after the first period, a voltage, which is changed from the first voltage, to the input node of the comparison circuit, the voltage being based on a capacitance ratio of the capacitance element to be tested and the capacitance element for testing, and
test capacitance of the capacitance element to be tested based on a comparison result of the comparison circuit, wherein:
the capacitance element for testing includes a first capacitance element for testing and a second capacitance element for testing,
capacitance of the first capacitance element for testing is different from capacitance of the second capacitance element for testing,
capacitance of the capacitance element to be tested is tested based on a comparison result of the comparison circuit when a voltage change based on the capacitance ratio is caused using the first capacitance element for testing, and a comparison result of the comparison circuit when a voltage change based on the capacitance ratio is caused using the second capacitance element for testing,
one end of the first capacitance element for testing and one end of the second capacitance element for testing are a same node as the input node of the comparison circuit,
when the first capacitance element for testing is used by supplying a non-zero positive voltage to another end of the first capacitance element for testing, the second capacitance element for testing is not used by supplying a zero voltage to another end of the second capacitance element for testing, and
when the second capacitance element for testing is used by supplying a non-zero positive voltage to the another end of the second capacitance element for testing, the first capacitance element for testing is not used by supplying a zero voltage to the another end of the first capacitance element for testing.

2. The integrated circuit according to claim 1, wherein the one end of the capacitance element for testing is electrically connected to the input node of the comparison circuit, and
the test circuit,
in the first period,
resets a charge accumulated in the capacitance element for testing to zero, and
electrically connects a first node to which the first voltage is applied to the input node of the comparison circuit, and
in the second period,
electrically unconnects the first node from the input node of the comparison circuit, and
changes a voltage applied to another end of the capacitance element for testing to cause a voltage change based on the capacitance ratio.

3. The integrated circuit according to claim 1, wherein the test circuit,
in the first period,
electrically connects a first node to which the first voltage is applied to the input node of the comparison circuit, and
electrically unconnects the one end of the capacitance element for testing from the input node of the comparison circuit, and
in the second period,
electrically unconnects the other end of the capacitance element to be tested from the input node of the comparison circuit, and electrically connects the one end of the capacitance element for testing to the input node of the comparison circuit, and
changes a voltage applied to the first node from the first voltage to a second voltage, and
in a third period after the second period,
electrically unconnects the first node from the input node of the comparison circuit, and
electrically connects the one end of the capacitance element for testing to the input node of the comparison circuit to cause a voltage change based on the capacitance ratio.

4. The integrated circuit according to claim 3, wherein the test circuit,
in the second period,
resets a charge accumulated in the capacitance element for testing to zero.

5. The integrated circuit according to claim 1, wherein the comparison circuit includes a first comparator, and a second comparator,
the reference voltage includes a first reference voltage, and a second reference voltage being a different voltage from the first reference voltage,
the first comparator compares the voltage of the input node with the first reference voltage, and outputs a first comparison result signal indicating the comparison result,
the second comparator compares the voltage of the input node with the second reference voltage, and outputs a second comparison result signal indicating the comparison result, and
the determination circuit determines, based on the first comparison result signal and the second comparison result signal, whether a voltage change based on a capacitance ratio at the input node is smaller than a predetermined range, in the predetermined range, or greater than the predetermined range.

6. The integrated circuit according to claim 5, comprising:
an adder configured to add an offset value to voltage data specifying the first reference voltage;
a first DA converter configured to convert the voltage data to the first reference voltage; and
a second DA converter configured to convert output data of the adder to the second reference voltage.

7. The integrated circuit according to claim 1, comprising:
an impedance converter configured to convert impedance of the input node and output the converted impedance to a terminal.

8. The integrated circuit according to claim 1, wherein
a plurality of driver circuits including the capacitance element to be tested are arrayed along a predetermined direction, and
the test circuit is
provided in a region adjacent, along the predetermined direction, to a region in which the plurality of driver circuits are arrayed.

9. The integrated circuit according to claim 8, wherein
the driver circuit generates a data signal of a voltage corresponding to gradation data using the capacitance element to be tested, and
outputs the data signal toward a pixel circuit that is brought into an optical state corresponding to a voltage of the data signal.

10. The integrated circuit according to claim 9, comprising:
a plurality of data lines, the driver circuit, and the pixel circuit, wherein
the driver circuit is provided corresponding to the plurality of data lines, and
the pixel circuit is provided corresponding to the plurality of data lines.

11. The integrated circuit according to claim 1, wherein
capacitance of the capacitance element to be tested is greater than capacitance of the capacitance element for testing.

12. The integrated circuit according to claim 11, wherein
a plurality of the capacitance elements to be tested are provided,
a plurality of the capacitance elements for testing are provided, and
the number of capacitance elements to be tested is greater than the number of capacitance elements for testing.

13. The integrated circuit according to claim 1, wherein
the capacitance element to be tested and the test circuit are included in the same semiconductor substrate.

14. A display device, comprising:
the integrated circuit according to claim 1.

* * * * *